United States Patent [19]
Yokoya et al.

[11] Patent Number: 5,714,303
[45] Date of Patent: Feb. 3, 1998

[54] IMAGE FORMING METHOD USING STRIPPABLE LAYER AND LIGHT-SENSITIVE POLYMERIZABLE LAYER CONTAINING SILVER HALIDE

[75] Inventors: Hiroaki Yokoya; Koji Shirakawa, both of Shizuoka, Japan

[73] Assignee: Fuji Photo Film Co., Ltd., Kanagawa, Japan

[21] Appl. No.: 755,915

[22] Filed: Nov. 25, 1996

Related U.S. Application Data

[62] Division of Ser. No. 559,886, Nov. 20, 1995, Pat. No. 5,612,167, which is a continuation of Ser. No. 148,512, Nov. 8, 1993, abandoned.

[30] Foreign Application Priority Data

| Nov. 6, 1992 | [JP] | Japan | 4-322602 |
| Nov. 6, 1992 | [JP] | Japan | 4-322603 |
| Nov. 6, 1992 | [JP] | Japan | 4-322604 |

[51] Int. Cl.$^6$ ................................ G03C 11/12
[52] U.S. Cl. ............ 430/257; 430/203; 430/252; 430/253; 430/255; 430/256; 430/258
[58] Field of Search .................... 430/203, 252, 430/253, 255, 256, 257, 258

[56] References Cited

U.S. PATENT DOCUMENTS

| 3,721,557 | 3/1973 | Inoue | 430/257 |
| 4,665,005 | 5/1987 | Aono et al. | 430/259 |
| 5,326,667 | 7/1994 | Yokoya et al. | 430/203 |

*Primary Examiner*—Hoa Van Le
*Attorney, Agent, or Firm*—Sughrue, Mion, Zinn, Macpeak & Seas, PLLC

[57] ABSTRACT

The present invention provides new image forming methods. The image forming methods use a combination of a light-sensitive material and an image receiving material. The light-sensitive material comprises a support, a strippable layer and a light-sensitive polymerizable layer in order. The light-sensitive polymerizable layer contains silver halide, a reducing agent and an ethylenically unsaturated polymerizable compound or a cross-linkable polymer. The light-sensitive polymerizable layer may further contain a colorant. An image forming method using the light-sensitive polymerizable layer containing no colorant comprises an exposing step, a developing step, a toning step and a transferring step. Another image forming method using the colorant-containing light-sensitive polymerizable layer comprises an exposing step, a developing step, a removing step and a transferring step. The present invention is characterized in that an image formed on the strippable layer is entirely transferred to the image receiving material. The strippable layer has a thickness of not less than 1.0 μm. A new light-sensitive material having the strippable layer is also disclosed.

6 Claims, 6 Drawing Sheets

IMAGE FORMING METHOD USING STRIPPABLE LAYER AND LIGHT-SENSITIVE POLYMERIZABLE LAYER CONTAINING SILVER HALIDE

This is a Divisional of application Ser. No. 08/559,886 filed Nov. 20, 1995, now U.S. Pat. No. 5,612,167 which is a continuation of application Ser. No. 08/148,512 filed Nov. 8, 1993, now abandoned.

FIELD OF THE INVENTION

The present invention relates to an image forming method using a polymerization reaction initiated by silver halide. The invention also relates to an image forming method using a light-sensitive material, which can be imaged with a scanning light such as a laser bean.

BACKGROUND OF THE INVENTION

As the computer technology has recently been developed, a technical innovation is greatly introduced in printing. The field of color printing is now digitized by using a computer system named as CEPS (Color Electronic Prepress System). The CEPS digitizes the printing data of a color image and the data of all the prepress process down to stripping. Further, the newest system directly outputs the digitized printing data to a presensitized printing plate of a high sensitivity to prepare a printing plate without use of a conventional lith film. The technical innovation in the printing field makes the lith film unnecessary.

Before running on, a proofread is necessary to inspect the finished quality of printing. The proofing systems include a pressproof and an analogue offpress proof. The pressproof comprises preparing a printing plate for a proof sheet and printing an image using a proof press. The analogue offpress proof employs an image forming system different from the printing system. The offpress system comprises uniformly exposing to light a light-sensitive material through a lith film. The light-sensitive material contains a photopolymer, and the light source usually is ultraviolet. These two proofing systems are based on the premise that the printing system uses a lith film. The proof sheet itself is prepared from the image on the lith film (M. H. Bruno, Principle of Color Proofing).

As is mentioned above, the conventional proofing system are based on use of the lith film. Now, it is an important problem how to inspect the printing quality when the technical innovation in the printing field makes the lith film unnecessary. Therefore, the newest printing system requires a proof system of preparing a proof sheet directly from digital image data without use of the lith film. The required proof system is named as DDCP (Digital Direct Color Proof). With respect to the DDCP, several systems have been proposed, and some of them are practically used.

The DDCP systems employ an electrophotography and a thermal transfer recording system, which are completely different from the conventional analogue offpress proof using a photopolymer. The proofing qualities of DDCP (such as resolving power, color tone, gradation, reproducibility of half tone, analogy to printing and stable reproducibility of the image) are insufficient compared with the conventional systems. The image qualities of the direct output from a digital image are not satisfied. Therefore, an improved proofing method that can directly output the digital image is required to obtain a color proof of high quality.

Japanese Patent Publication No. 48(1973)-31323, Japanese Patent Provisional Publications No. 59(1984)97140, No. 61(1986)-188537, No. 62(1987)-267736, No. 2(1990)-244151 and U.S. Pat. No. 3,770,438 disclose an analogue offpress proof using a conventional photopolymer. Japanese Patent Provisional Publications No. 59(1984)-97140 and No. 61(1986)-188537 disclose a process of forming an image on a strippable layer provided on a temporary support and transferring the image together with the strippable layer to a permanent support. In this process, an image of high resolving power can be entirely transferred by using the strippable layer.

If the digital image data can directly be recorded on the offpress proof using the photopolymer, the proofing qualities are probably satisfactory. However, the digital image data should be recorded on a light-sensitive material for proof by a scanning exposure using a specific light source such as a laser beam. Therefore, the light-sensitive material should have a high sensitivity to the wave length of the scanning light. The conventional light-sensitive material using a photopolymer does not have such a high sensitivity. Further, it is particularly difficult to sensitize the photopolymer to a laser beam of a long wave such as a He-Ne laser and a semiconductor laser. The photopolymer merely has a sensitivity to a laser beam of a short wave. Accordingly, the conventional analogue off-press proof is not available in the DDCP systems.

In conclusion, the offpress proof using a photopolymer cannot directly record the digital image data, since the photopolymer does not have a high sensitivity to the wave length of the scanning light (particularly a laser beam of a long wave). On the other hand, the proofing qualities of the conventional DDCP systems (using an electrophotography or a thermal transfer recording system) are insufficient with respect to resolving power, reproducibility of half tone or stable reproducibility of color. Therefore, a new DDCP method is required to record a color proof of high quality with a high sensitivity to the wave length of a scanning light.

By the way, Japanese Patent Provisional Publications No. 61(1986)-69062 and No. 61(1986)-73145 (the contents of these two publications are described in U.S. Pat. No. 4,629, 676 and European Patent Provisional Publication No. 0174634A) discloses an image forming method using a light-sensitive material that contains silver halide, a reducing agent and a polymerizable compound. The method comprises the steps of imagewise exposing to light the light-sensitive material, and heating the material to develop the silver and to harden imagewise the polymerizable compound. Thus a polymer image is formed on the light-sensitive material. The sensitivity of silver halide is several thousand times as high as that of a photopolymerization initiator.

In a representative embodiment of the method, the developed light-sensitive material (containing a colorant) is pressed on an image receiving material to transfer the colorant with the unpolymerized polymerizable compound selectively to the image receiving material. Thus a color image is formed on the image receiving material. In the case that a multicolor image is formed on the image receiving material, the light-sensitive material should contain two or more kinds of microcapsules (or packet emulsions) each containing a colorant different from each other.

SUMMARY OF THE INVENTION

The present inventors paid attention to the image forming method using a polymerization reaction initiated by silver halide, and have tried to apply the method to formation of a color proof. However, the inventors note some problems when the image forming method itself is applied to the color proof.

For example, the resolving power of the light-sensitive material is limited to the size of the microcapsules (usually more than 10 μm). Further, the microcapsules are ruptured by pressure to form an image. The resolving power is more degraded than the size of the microcapsules, since the contents of the microcapsules are spread by the pressure.

The inventors have further tried to use a strippable layer disclosed in Japanese Patent Provisional Publications No. 59(1984)-97140 and No. 61(1986)-188537 in a light-sensitive material containing silver halide, a reducing agent and a polymerizable compound. If a strippable layer is effective in the image forming system using silver halide, the clear image of high sensitivity and high resolving power formed in the light-sensitive material can be entirely transferred to an image receiving material. However, it is difficult to transfer an image from the light-sensitive material having the strippable layer. Sometimes no image was transferred. Therefore, the strippable layer used in the system of a photopolymerization initiator cannot be applied to the system using silver halide.

The above-mentioned problems are due to the inherent difference between the image forming system using silver halide as photosensor and the system using a photopolymerization initiator as photosensor. Therefore, it is necessary to develop an image transfer system using a strippable layer appropriate for the system using silver halide.

An object of the present invention is to improve the image forming method using a polymerization reaction initiated by silver halide and to provide a method of transferring an image of a high sensitivity and a high resolving power.

Another object of the invention is to provide an image forming method, which can form a color proof directly from digital image data without use of a lith film.

A further object of the invention is to provide an image forming method, which forms a color proof of a high quality by a scanning exposure with a laser beam, particularly a laser beam of a long wave.

The present invention provides an image forming method comprises the following two embodiments.

The first embodiment of the present invention is an image forming method comprising the steps of (1), (2), (3) and (4):

(1) imagewise exposing to light a light-sensitive polymerizable layer of a light-sensitive material, which comprises a support, a strippable layer and the light-sensitive polymerizable layer in order, said light-sensitive polymerizable layer containing silver halide, a reducing agent and an ethylenically unsaturated polymerizable compound or a cross-linkable polymer, and said strippable layer having a thickness of not less than 1.0 μm (exposing step);

(2) heating the light-sensitive polymerizable layer at a temperature of 70° to 200° C. to harden the ethylenically unsaturated polymerizable compound or the cross-linkable polymer within the exposed area or, in the alternative, within the unexposed area (developing step);

(3) applying color toner on the adhesive surface of the unhardened area whereby a toner image is formed thereon (toning step); and (4) placing the light-sensitive material in contact with an image receiving material whereby the toner image together with the strippable layer is transferred to the image receiving material (transferring step).

The second embodiment of the invention is an image forming method comprising the steps of (1), (2), (3) and (4):

(1) imagewise exposing to light a light-sensitive polymerizable layer of a light-sensitive material, which comprises a support, a strippable layer and the light-sensitive polymerizable layer in order, said light-sensitive polymerizable layer containing silver halide, a reducing agent, an ethylenically unsaturated polymerizable compound or a cross-linkable polymer and a colorant, and said strippable layer having a thickness of not less than 1.0 μm (exposing step);

(2) heating the light-sensitive polymerizable layer at a temperature of 70° to 200° C. to harden the ethylenically unsaturated polymerizable compound or the cross-linkable polymer within the exposed area or, in the alternative, within the unexposed area (developing step);

(3) removing the unhardened area using a solvent to obtain a hardened color replica image (removing step); and (4) placing the light-sensitive material in contact with an image receiving material whereby the hardened color replica image together with the strippable layer is transferred to the image receiving material (transferring step).

The present invention further provides a new light-sensitive material, which comprises a support, a strippable layer and the light-sensitive polymerizable layer in order, said light-sensitive polymerizable layer containing silver halide, a reducing agent, an ethylenically unsaturated polymerizable compound or a cross-linkable polymer and a colorant, and said strippable layer having a thickness of not less than 1.0 μm.

The light-sensitive polymerizable layer preferably comprises a light-sensitive layer containing the silver halide and a polymerizable layer containing the ethylenically unsaturated polymerizable compound or the cross-linkable polymer.

The colorant used in the second embodiment is contained in the polymerizable layer. The reducing agent may be contained in the light-sensitive layer or the polymerizable layer. Further, the light-sensitive polymerizable layer may comprise a light-sensitive layer, a polymerizable layer and an overcoating layer. The reducing agent may also be contained in the overcoating layer. In the present specification, the light-sensitive polymerizable layer comprising two or more functional layers is referred to as "a complex light-sensitive polymerizable layer." A light-sensitive material having the complex light-sensitive polymerizable layer is referred to as "a multi-layered light-sensitive material." On the other hand, a light-sensitive material having a single light-sensitive polymerizable layer is referred to as "a single-layered light-sensitive material."

When a multi-layered light-sensitive material is used in the first embodiment, the light-sensitive layer should be removed between the developing step and the toning step. When a multi-layered light-sensitive material is used in the second embodiment, the light-sensitive layer should be removed between the developing step and the removing step. In the case that layers other than the light-sensitive layer and the polymerizable layer is provided on a support, the layer provided on or above the polymerizable layer should also be removed.

The above-mentioned steps are preferably repeated twice or more using light-sensitive materials or color toners each having a color different from each other, to form a multicolor image on the image receiving material. The color is determined by the kind of the colorant or the color toner.

In the present invention, two or more steps can be conducted simultaneously provided that the above-defined order is not reversed. For example, the exposing step (1) can be conducted simultaneously with the developing step (2). A process conducting two or more steps simultaneously is included within the scopes of the present invention.

The image forming method of the present invention uses silver halide as photosensor. Therefore, the method forms a clear image of high sensitivity and high resolving power. Further, a color proof can be formed directly from digital image data without use of a lith film. Silver halide has a sufficient sensitivity to a laser beam, particularly to a laser beam of a long wave.

The image forming method of the invention is characterized in that the image of high sensitivity and high resolving power formed on the light-sensitive material is entirely transferred together with the strippable layer to an image receiving layer. Therefore, the method of the invention forms a clear transferred image of high resolving power, compared with a conventional image forming method using microcapsules.

Further, the strippable layer has a thickness of not less than 1.0 μm according to the present invention. According to study of the applicants, the strippable layer of the system using a photopolymerization initiator cannot be applied to the system using silver halide because of a serious problem. The problem is that the hardened area on the strippable layer is scarcely transferred, while the unhardened are is well transferred. The problem was not observed in the system of the photopolymerization initiator, and is caused in only the system of silver halide. The applicants further note that the problem is due to a heat developing process, which is not included in the system of the photopolymerization initiator.

The above-mentioned problem is now solved by using a thick strippable layer. Therefore, the method of the present invention forms a clear transferred image.

DETAILED DESCRIPTION OF THE INVENTION

Figure 1:
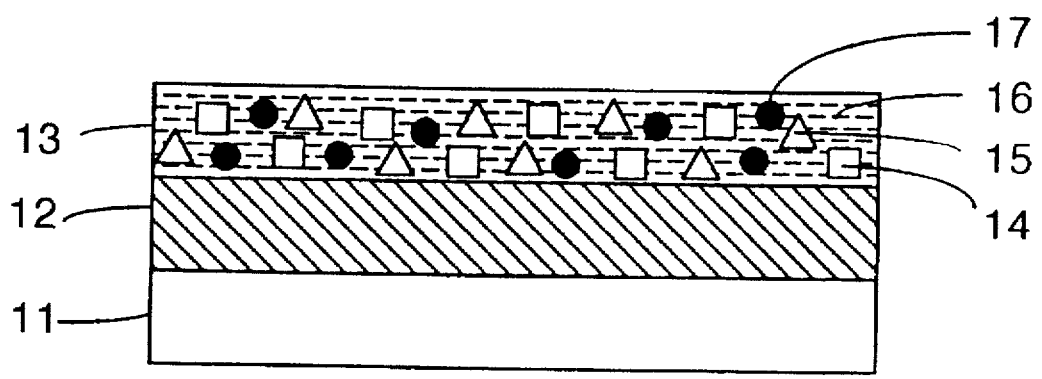
FIG. 1 is a sectional view schematically illustrating a single-layered light-sensitive material used in the second embodiment of the image forming method of the present invention.

First, preferred embodiments of the present invention are described below.

(1) The light-sensitive polymerizable layer preferably comprises a light-sensitive layer containing the silver halide and a polymerizable layer containing the ethylenically unsaturated polymerizable compound or the cross-linkable polymer.

(2) The steps of each of the embodiments are preferably repeated twice or more using light-sensitive materials or color toners each having a color different from each other, to form a multicolor image on the image receiving material.

(3) The light-sensitive polymerizable layer preferably further contains a base or base precursor. With respect to the complex light-sensitive polymerizable layer, the base or base precursor can be contained in the light-sensitive layer or the polymerizable layer. The base precursor is preferred to the base. The base or base precursor may be contained in an overcoating layer.

(4) The light-sensitive polymerizable layer may further contain a heat development accelerator. With respect to the complex light-sensitive polymerizable layer, the heat development accelerator is preferably contained in the polymerizable layer. The heat development accelerator may be contained in an overcoating layer.

(5) The strippable layer preferably contains a matrix polymer having a flow softening point that is higher the heating temperature.

(6) The strippable layer preferably contains a fluorine compound in an amount of not less than 1 wt. %.

(7) The strippable layer preferably contains a polyvinyl acetal resin as matrix.

Next, the layered structure of the (single-layered or multi-layered) light-sensitive material used in the image forming method of the present invention is described below referring to the drawings.

FIG. 1 is a sectional view schematically illustrating a single-layered light-sensitive material used in the second embodiment of the image forming method of the present invention.

A strippable layer (12) is provided on a support (11). A single light-sensitive polymerizable layer (13) is provided on the strippable layer (12). The light-sensitive polymerizable layer (13) contains silver halide (14), a reducing agent (15), an ethylenically unsaturated polymerizable compound or a cross-linkable polymer (16) and a colorant (17). The colorant (17) is not necessary in the first embodiment of the invention.

Figure 2:
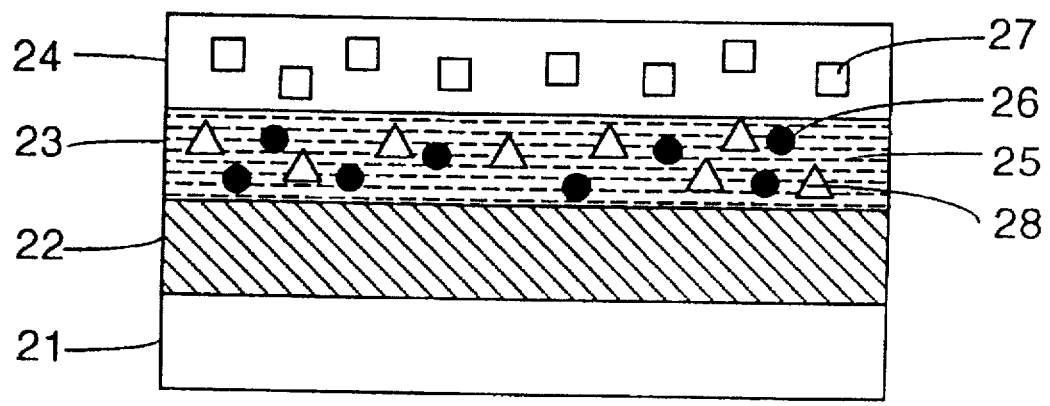
FIG. 2 is a sectional view schematically illustrating a multi-layered light-sensitive material used in the second embodiment of the image forming method.

FIG. 2 is a sectional view schematically illustrating a multi-layered light-sensitive material used in the second embodiment of the image forming method.

A strippable layer (22) is provided on a support (21). A polymerizable layer (23) is provided on the strippable layer (22), and a light-sensitive layer (24) is provided on the polymerizable layer (23). The polymerizable layer (23) contains an ethylenically unsaturated polymerizable compound or a cross-linkable polymer (25), a colorant (26) and a reducing agent (28). The colorant (26) is not necessary in the first embodiment of the invention. The light-sensitive layer (24) contains silver halide (27).

The reducing agent can be contained in the light-sensitive layer (24) though the reducing agent (28) is contained in the polymerizable layer (23) of the light-sensitive material shown in FIG. 2. The reducing agent may be contained in both of the polymerizable layer and the light-sensitive layer in any ratio of the amount. Further, the reducing agent may be contained in an overcoating layer. Similarly, the reducing agent can also be contained in any layers of the other light-sensitive materials described below.

The above-described layered structures are examples of the light-sensitive material. The present invention is not limited to the examples.

For example, optional layers such as an undercoating layer, an overcoating layer (e.g., a protective layer or a cover sheet), an intermediate layer and a backing layer can be provided on the light-sensitive material. The under-coating layer is provided on the support. The overcoating layer is provided as the uppermost layer. The intermediate layer is provided between the functional layers. The backing layer is provided on the reverse side of the light-sensitive polymerizable layer (the back side of the support).

The two embodiments of the image forming method of the present invention are described below referring to the drawings.

Figure 3:
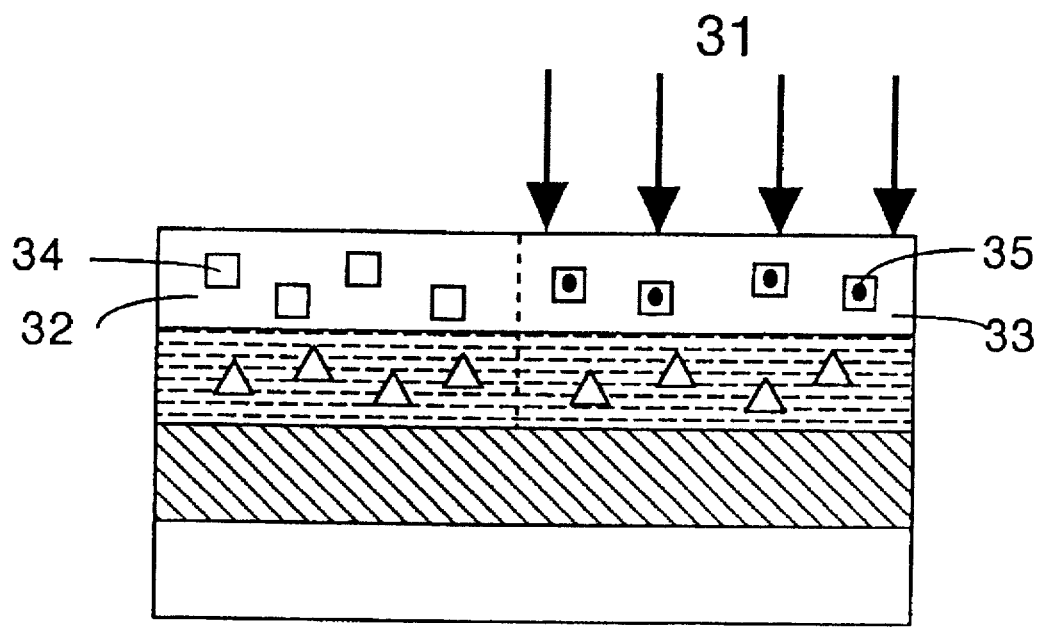
FIG. 3 is a sectional view schematically illustrating the exposing step of the first embodiment of the image forming method.

FIG. 3 is a sectional view schematically illustrating the exposing step of the first embodiment of the image forming method.

A latent image of silver halide (35) is formed within the exposed area (33), where the light-sensitive layer is exposed to light (31). On the other hand, silver halide (34) within the unexposed area (32) is not substantially changed.

The exposing step is described in FIG. 3 by using a multi-layered light-sensitive material shown in FIG. 2. The single-layered light-sensitive material shown in FIG. 1 can also be exposed to light in the same manner.

Figure 4:
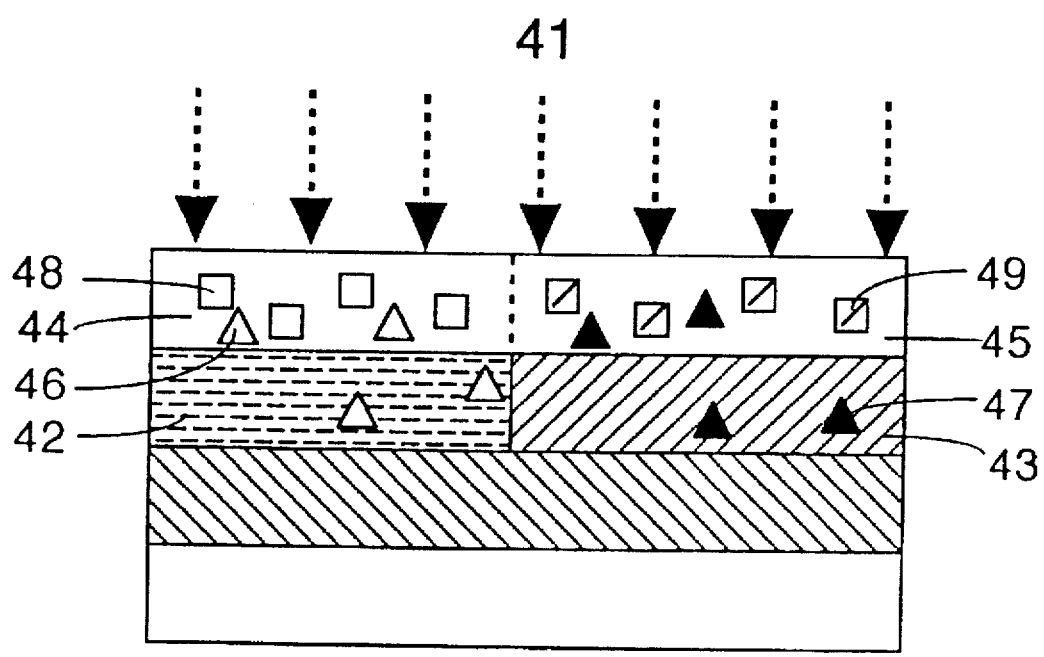
FIG. 4 is a sectional view schematically illustrating the developing step of the first embodiment of the image forming method.

FIG. 4 is a sectional view schematically illustrating the developing step of the first embodiment of the image forming method.

When the light-sensitive material is heated (41), a reducing agent is moved from a polymerizable layer (42 and 43) to a light-sensitive layer (44 and 45). The reducing agent develops the latent image of silver halide within the exposed area of the light-sensitive layer (45). A silver image (49) is formed from the developed silver halide, and the reducing agent is simultaneously oxidized to form an oxidation product. The oxidation product is unstable in the system of the present invention to form a radical (47). This radical is hereinafter referred to as "oxidation radical." The oxidation radical of the reducing agent (47) is moved from the exposed area of the light-sensitive layer (45) to the exposed area of the polymerizable layer (43). An ethylenically unsaturated polymerizable compound or a cross-linkable polymer is hardened by the function of the radical. Thus, the hardened area (43) is formed. On the other hand, the reducing agent (46) contained in the unexposed area of the polymerizable layer and silver halide (48) contained in the unexposed area of the light-sensitive layer are not substantially changed. Thus, the unexposed area of the polymerizable layer (42) is not hardened.

The developing step is described in FIG. 4 by using a system wherein the ethylenically unsaturated polymerizable compound or the cross-linkable polymer is hardened within the exposed area. The other system wherein the compound or the polymer is hardened within the unexposed area is also available by changing the conditions such as the kind of the reducing agent. The details are described at the item of [Reducing agent].

Figure 5:
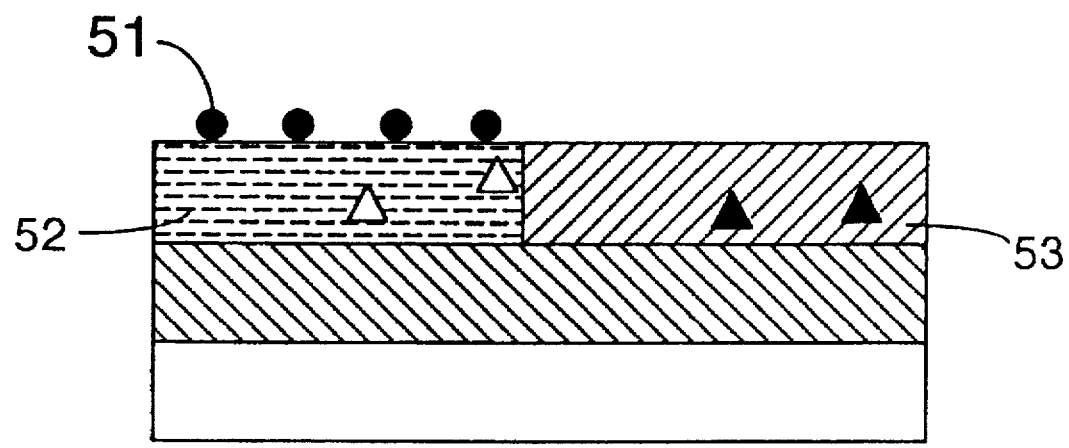
FIG. 5 is a sectional view schematically illustrating the toning step of the first embodiment of the image forming method.

FIG. 5 is a sectional view schematically illustrating the toning step of the first embodiment of the image forming method.

Color toner (51) is applied to the surface of the polymerizable layer of the light-sensitive material. Thus the toner is selectively attached to the adhesive surface of the unhardened polymerizable layer (52) to form a toner image. The toner is not attached to the hardened area of the polymerizable layer (53).

Figure 6:
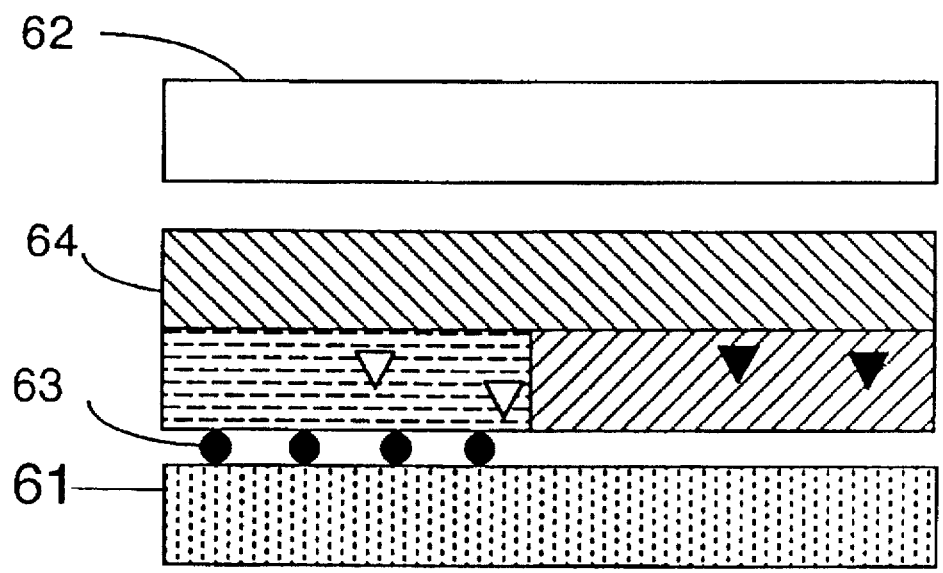
FIG. 6 is a sectional view schematically illustrating the transferring step of the first embodiment of the image forming method.

FIG. 6 is a sectional view schematically illustrating the transferring step of the first embodiment of the image forming method.

FIG. 6 shows an image receiving material (61) and a light-sensitive material (62) just after the image is transferred. The light-sensitive material (62) is placed in contact with the image receiving material (61). Thus, the toner image (63) formed on the unhardened area is transferred together with the strippable layer (64) from the light-sensitive material to the image receiving material.

Figure 7:
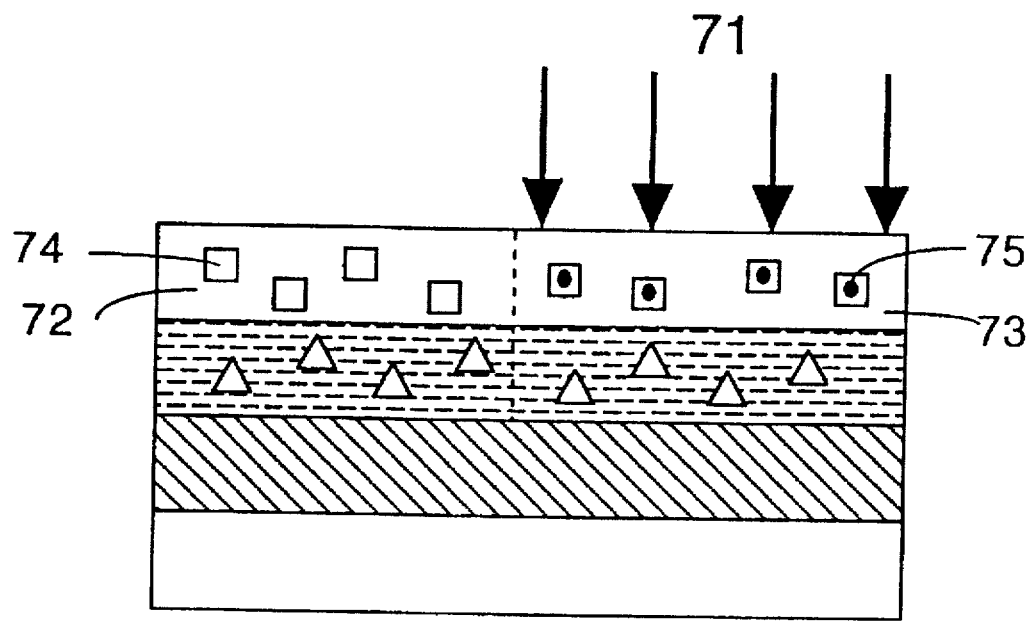
FIG. 7 is a sectional view schematically illustrating the exposing step of the second embodiment of the image forming method.

FIG. 7 is a sectional view schematically illustrating the exposing step of the second embodiment of the image forming method.

A latent image of silver halide (75) is formed within the exposed area (73), where the light-sensitive layer is exposed to light (71). On the other hand, silver halide (74) within the unexposed area (72) is not substantially changed.

Figure 8:
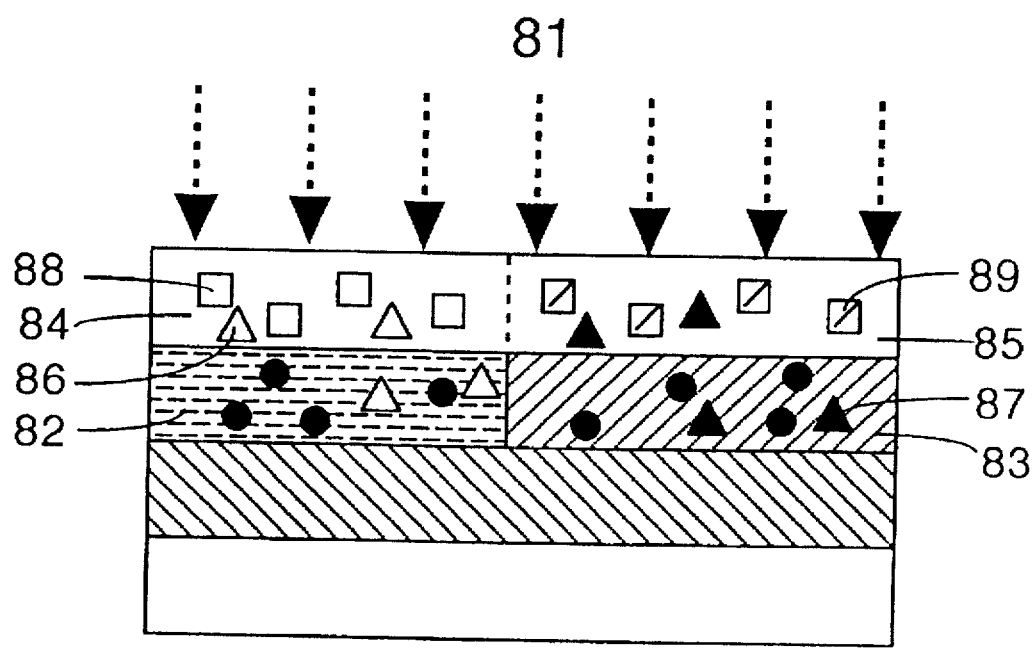
FIG. 8 is a sectional view schematically illustrating the developing step of the second embodiment of the image forming method.

FIG. 8 is a sectional view schematically illustrating the developing step of the second embodiment of the image forming method.

When the light-sensitive material is heated (81), a reducing agent is moved from a polymerizable layer (82 and 83) to a light-sensitive layer (84 and 85). The reducing agent develops the latent image of silver halide within the exposed area of the light-sensitive layer (85). A silver image (89) is formed from the developed silver halide, and the reducing agent is simultaneously oxidized to form an oxidation product. The oxidation product is unstable in the system of the present invention to form an oxidation radical (87). The oxidation radical (87) is moved from the exposed area of the light-sensitive layer (85) to the exposed area of the polymerizable layer (83). An ethylenically unsaturated polymerizable compound or a cross-link-able polymer is hardened by the function of the radical. Thus, the hardened area (83) is formed. On the other hand, the reducing agent (86) contained in the unexposed area of the polymerizable layer and silver halide (88) contained in the unexposed area of the light-sensitive layer are not substantially changed. Thus, the unexposed area of the polymerizable layer (82) is not hardened.

Figure 9:
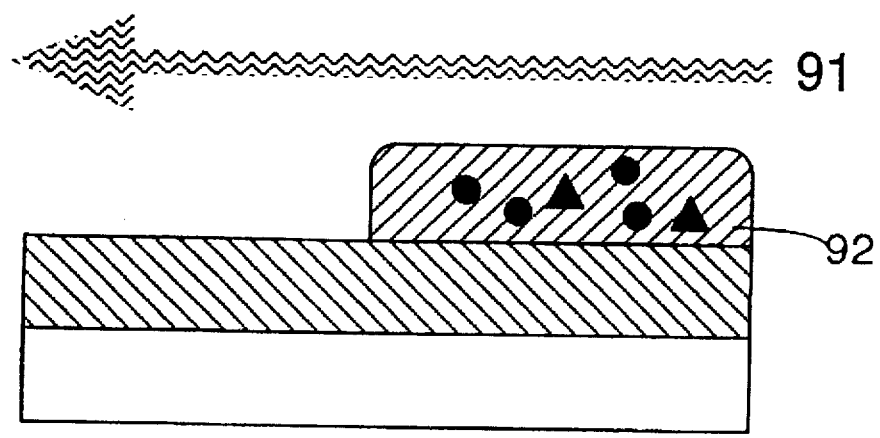
FIG. 9 is a sectional view schematically illustrating the removing step of the second embodiment of the image forming method.

FIG. 9 is a sectional view schematically illustrating the removing step of the second embodiment of the image forming method. The unhardened area of the polymerizable layer is removed with a solvent (81) to form a color replica image on the hardened area (82). The light-sensitive layer is peeled before the removing step, or is removed together the unhardened area of the polymerizable layer with the solvent at the removing step.

Figure 10:
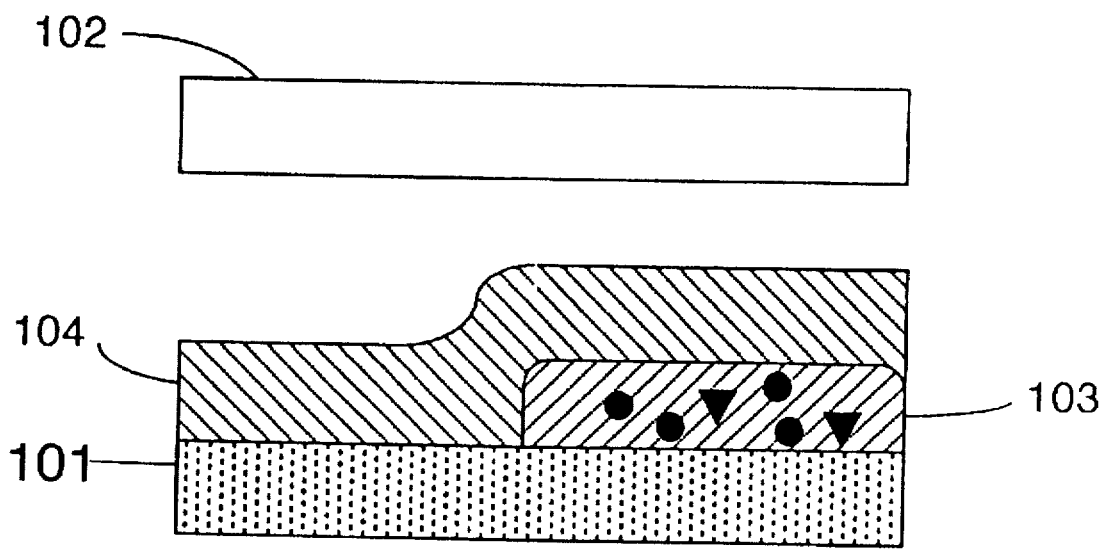
FIG. 10 is a sectional view schematically illustrating the toning step of the second embodiment of the image forming method.

FIG. 10 is a sectional view schematically illustrating the transferring step of the second embodiment of the image forming method. FIG. 10 shows an image receiving material (101) and a light-sensitive material (102) just after the image is transferred. The light-sensitive material (102) is placed in contact with the image receiving material (101). Thus, the color image (103) formed on the hardened area is transferred together with the strippable layer (104) from the light-sensitive material to the image receiving material.

The above are the representative embodiments of the image forming method. In the image forming method of the present invention, optional steps may be added to the above-described steps.

When a multi-layered light-sensitive material is used, the light-sensitive layer and the layer provided on or above the polymerizable layer should be removed before the toning step or the removing step (after the developing step) or simultaneously with the removing step. The layers may be peeled to be removed. Further, the layers may be dissolved in or swelled with a solvent that does not dissolve the polymerizable layer. Furthermore, the layers may be removed together the unhardened area of the polymerizable layer with a solvent.

The single-color or multicolor image formed on the image receiving material may be further transferred to another (secondary) image receiving material.

In the present invention, the image is reversed by the transferring step. The reversed image is appropriate in the case that the final color image is formed on a transparent support. On the other hand, the final image should be an erect image in the case that the image is formed on an opaque support. The reversed image can be changed to the erect image by a reversal exposure or an additional transferring step. The relation between the reversed image and the erect image should be noted when the method further contains the above-mentioned additional transferring step.

The other optional steps may be added to the method. Examples of the optional steps include a step of removing optional layers (e.g., an intermediate layer, a backing layer), a step of dull-finishing the surface of the image receiving material on which an image has been formed, and a step of adding a matting agent to the image receiving material.

The main steps of the present invention are described below in more detail.

[Exposing step]

The light-sensitive material can be imagewise exposed to light from the surface of the layers (the reverse side of the support). The material can also be imagewise exposed to light from the side of the support.

Examples of the exposing methods include a reflective exposure, a contact exposure through a transparent positive and a scanning exposure. The reflective exposure uses a xenon lamp, a tungsten lamp or a fluorescent lamp as the light source. The scanning exposure uses a laser beam or a light emission diode as the light source. The present invention is characterized in that an image is formed from the light-sensitive material having a sensitivity to a scanning light. Therefore, the method of the present invention is particularly advantageous to the scanning exposure.

Examples of the laser beams include a helium-neon laser, a helium-cadmium laser, an argon ion laser, a krypton ion laser, a YAG laser, a ruby laser, a nitrogen laser, a dye laser, an excimer laser, a semiconductor (e.g., GaAs/GaAlAs, InGaAsP) laser, an alexandrite laser, a copper vapor laser and an erbium laser. A light emission diode and a liquid crystal shutter are also available as the light source of the scanning exposure. The light emission diode and the liquid crystal shutter include a light emission diode array and a liquid crystal shutter array, which are used as the light-source of a line printer.

The wavelength of the light corresponds to the spectral sensitivity of silver halide. Near ultraviolet, visible and near infrared regions are available. The amount of the exposure is generally determined by a sensitivity of the silver halide emulsion. The amount is usually in the range of 0.01 to 10.000 ergs/cm$^2$. At the exposing step, a latent image of silver halide is formed within the exposed area.

[Developing step]

The light-sensitive material is developed by heating. The developing step can be conducted simultaneously with the exposing step.

The exposed light-sensitive material can be directly or indirectly heated by the known heating means. The heat development can be conducted by placing the light-sensitive material in contact with a heated material (e.g., heated plate roller), heating the light-sensitive material by a radiation heat of an infrared ray lamp, placing the light-sensitive material in a heated zone, or passing the light-sensitive material through a heated zone. The surface of the light-sensitive material may be covered to prevent the influence of the air on the developing reaction. The heating temperature and the heating time are determined by the characteristics of the light-sensitive material. The heating temperature is in the range of 70° to 200° C. The heating time is preferably in the range of 1 to 180 seconds.

At the developing step, the latent image of silver halide is developed, and an oxidation product of the reducing agent is formed within the exposed area. In the case that the oxidation product has a function of accelerating a polymerization reaction, an ethylenically unsaturated polymerizable compound or a cross-linkable polymer is hardened within the exposed area. In the case that the oxidation product has a function of inhibiting a polymerization reaction, an ethylenically unsaturated polymerizable compound or a cross-linkable polymer is hardened within the unexposed area.

In the system wherein the unexposed area is hardened, a thermal polymerization initiator or a photopolymerization initiator is preferably contained in the light-sensitive material. When the photopolymerization initiator is used, the light-sensitive material is uniformly exposed to light after the developing step.

[Toning step] (first embodiment)

The toning step is conducted by spreading the color toner on the adhesive surface of the light-sensitive polymerizable layer and rubbing the surface with a cloth or a sponge. An automatic toning machine (e.g., 2900 type of Du Pont de Nemours & Co.) is available. A process of toning an adhesive surface is disclosed in Japanese Patent Publications No. 48(1973)-31323, No. 1(1989)-36611 and Japanese Patent Provisional Publication No. 59(1984)-104665.

The toner is attached to the adhesive surface to form an image. The toner is preferably in the form of powder. The average particle size of the powder toner is preferably in the range of 0.1 to 50 µm. The powder can be made from a colorant (pigment or dye) or a mixture of the colorant with a resin binder. The mixture may further contain an optional component. Various known organic or inorganic pigments or dyes are available as the colorant. The pigments and dyes are listed in the color index. The colorant contained in the light-sensitive material (described at the item of [Colorant]) is also available.

Various known natural or synthetic polymers are available as the resin binder of the color toner. Examples of the resin binders include polyvinyl chloride, cellulose acetate, cellulose acetate butylate, polystyrene, polymethyl methacrylate, methyl cellulose and carboxymethyl cellulose. The toner may further contain optional components, such as a plasticizer, a monomer, a surface active agent, an antistatic agent, a dispersing agent and a surfactant. The color toner is described in U.S. Pat. No. 3,620,726, U.S. Pat. No. 4,304,843, U.S. Pat. No. 4,397,941, U.S. Pat. No. 4,461,822, U.S. Pat. No. 4,546,072 and U.S. Pat. No. 4,215,193, Japanese Patent Publications No. 1(1989)-36611 and No. 49(1974)-7750 and Japanese Patent Provisional Publication No. 59(1984)-104665.

[Removing step] (second embodiment)

After the developing step, the light-sensitive polymerizable layer (the polymerizable layer of the multi-layered light-sensitive material) is hardened within the exposed area or, in the alternative, within the unexposed area. As a result, the solubility of the layer in a solvent is changed. The hardened area is not dissolved in the solvent, while the unhardened area is dissolved in the solvent. Thus, a hardened image is formed on the light-sensitive material.

The solvent (an etching solution) preferably is an alkaline solution. Examples of the alkaline solutions include an aqueous solution of an alkaline compound, an organic solution of an alkaline compound or a mixture thereof.

Various organic or inorganic compounds are available as the alkaline compound Examples of the alkaline compound include sodium hydroxide, potassium hydroxide, sodium carbonate, sodium silicate, potassium silicate, sodium metasilicate, potassium metasilicate, sodium phosphate, potassium silicate, ammonia and aminoalcohols (e.g., monoethanolamine, diethanolamine, triethanolamine).

Water or an organic liquid is used as the solvent. Water is preferred to the organic liquid. When a mixture of water with the organic liquid is used, the amount of water is preferably larger than the organic liquid. The organic liquid preferably is an alcohol or an ether. Examples of the alcohols include lower alcohols (e.g., methanol, ethanol, propanol, butanol), alcohols having an aromatic group (e.g., benzyl alcohol, phenethyl alcohol), polyhydric alcohols (e.g., ethylene glycol, diethylene glycol, triethylene glycol, polyethylene glycol) and aminoalcohols (e.g., monoethanolamine, diethanolamine, triethanolamine). Examples of the ethers are cellosolves.

The solvent may further contain the other additives such as a surface active agent and a defoaming agent.

[Transferring step]

At the transferring step of the first embodiment, the color toner on the surface of the light-sensitive material is placed in contact with an image receiving material to transfer the toner together with the (light-sensitive) polymerizable layer and the strippable layer to the image receiving material. The transferring step is conducted by pressure or heat. Another layer (e.g., an adhesive layer, an undercoating layer) may be transferred to the image receiving material together with the color toner. The conditions of the transferring step such as temperature and pressure are determined by the characteristics of the color toner, the strippable layer, the light-sensitive layer and the image receiving material. The temperature is preferably in the range of 10° to 200° C., and the pressure is preferably in the range of 0 to 2,000 kg/cm$^2$.

At the transferring step of the second embodiment, the surface of the imagewise hardened light-sensitive material is placed in contact with an image receiving material to transfer the color replica image of the hardened area together with the strippable layer to the image receiving material. The transferring step is conducted by pressure or heat. A layer (e.g., an undercoating layer) other than the (light-sensitive) polymerizable layer and the strippable layer may be transferred to the image receiving material together with the hardened area and the strippable layer. The conditions of the transferring step such as temperature and pressure are determined by the characteristics of the polymerizable layer, the strippable layer and the image receiving material. The temperature is preferably in the range of 10° to 200° C., and the pressure is preferably in the range of 0 to 2,000 kg/cm$^2$.

The image receiving material can be made of an art paper, a coated paper, a printing paper and or a plastic sheet. A resin binder, a plasticizer, a surfactant or a matting agent may be coated on the paper or the sheet.

The components and the elements of the light-sensitive material used in the image forming method of the present invention are described below in more detail.

[Strippable layer]

The strippable layer is not adhesive at room temperature so that it is easily removed from a support. The layer usually is adhesive at an elevated temperature. According to the present invention, the adhesive layer has a thickness of not less than 1.0 μm. In the case that the strippable layer comprises two or more layers, the total thickness of the layers is not less than 1.0 μm. The thickness preferably is not less than 1.4 μm.

The strippable layer usually contains an organic polymer as matrix.

Examples of the organic polymers include a polyacrylic ester, an acrylic ester copolymer, a polymethacrylic ester, a methacrylic ester copolymer, a polyacrylamide, an acrylamide copolymer, polyvinyl acetate, a vinyl acetate copolymer, polyvinyl chloride, a vinyl chloride copolymer, polyvinylidene chloride, a vinylidene chloride copolymer, polystyrene, a styrene copolymer, a ethylene copolymer (e.g., ethylene/vinyl acetate copolymer, ethylene/vinyl chloride copolymer, ethylene/acrylic ester copolymer, ethylene/acrylic acid copolymer), a polyvinyl acetal (e.g., polyvinyl butyral, polyvinyl formal), a polyester, a polyamide (e.g., nylon, a nylon copolymer), a natural or synthetic rubber (e.g., rubber chloride) and a polyolefin. A polyvinyl acetal and a polyamide are preferred. A polyvinyl acetal is particularly preferred. Two or more polymers may be used in combination.

The matrix polymer preferably has a flow softening point that is higher the heating temperature required for developing silver halide. In the present specification, the flow softening point is measured at the pressure of 100 kg/cm$^2$ and at the increasing rate of the temperature of 6 ° C./min by using a nozzle of 1 mm φ×10 m according to a high chemical flow testing method. The heating temperature is in the range of 70° to 200° C.

As is described above, a polyvinyl acetal is preferably used as matrix of the strippable layer. The polyvinyl acetal is a denatured polyvinyl alcohol. The denatured polyvinyl alcohols are described in pages 81 to 83 of "Synthetic Polymer III," Shunsuke Murahashi, Minoru Imoto and Hisaya Tani, Asakura-shoten (written in Japanese); and pages 281 to 285 of "Poval," 3rd edition, Kobunshi-kankokai (written in Japanese).

The polyvinyl acetal is synthesized by acetalate the most of hydroxyl groups of polyvinyl alcohol, which may include a partially saponified polyvinyl acetate. The acetalation includes ketalation. Namely, the term "acetal" is used in a broad sense in the present specification. Accordingly, an aldehyde or a ketone reacts on polyvinyl alcohol to form the polyvinyl acetal.

The polyvinyl acetal generally comprises the following three copolymerization units.

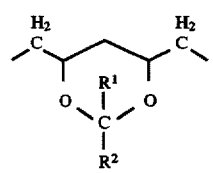

(I)

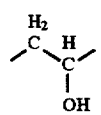

(II)

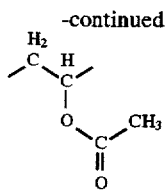

The formula (I) means the basic unit of the polyvinyl acetal.

In the formula (I), $R^1$ is hydrogen, an alkyl group or an alkenyl group. $R^2$ is an alkyl group or an alkenyl group.

When $R^1$ is hydrogen, the unit means an acetal in a narrow sense. When $R^1$ is an alkyl group or an alkenyl group, the unit means a ketal. $R^1$ preferably is hydrogen. The alkyl group or the alkenyl group of $R^1$ preferably has 1 to 10 carbon atoms, and more preferably has 1 to 6 carbon atoms. The polyvinyl acetal preferably has butyral, namely $R^1$ preferably is hydrogen and $R^2$ preferably is butyl.

The molar ratio of the unit of the formula (I) preferably is 30 to 90%, and more preferably is 50 to 80%.

The formula (II) means the remaining vinyl alcohol unit after the preparation of polyvinyl acetal from polyvinyl alcohol.

The molar ratio of the unit of the formula (II) preferably is 10 to 50%, and more preferably is 20 to 40%

The formula (III) means the remaining vinyl acetate unit after the preparation of polyvinyl alcohol from polyvinyl acetate.

The molar ratio of the unit of the formula (III) preferably is 0 to 30%, and more preferably is 0 to 10%.

The average polymerization degree of the polyvinyl acetal is preferably in the range of 100 to 500.

Polyvinyl butyral is a well known polyvinyl acetal resin. Polyvinyl butyral is synthesized by using butyric aldehyde. Polyvinyl butyral is preferably used in the present invention. In addition to the butyric aldehyde, acetaldehyde, propyric aldehyde and allyric aldehyde are available. The aldehyde may have one or more substituent groups.

Various polyvinyl acetal resins, particularly polyvinyl butyral resins are commercially available. Examples of the commercially available polyvinyl butyral resins include Esrek BL-1, BL-2, BL-3, BL-S, BX-L, BM-1, BM-2, BM-5, BM-S, BH-3, BX-1, BX-2, BX-5, BX-55, BH-S (Sekisui Chemical Co., Ltd.); and Denka Butyral #2000-L, #3000-1, #3000-2, #3000-K, #3000-4, #4000-1, #4000-2, #5000-A, #6000-C (Denki Kagaku Kogyo K. K.). Examples of the polyvinyl acetal resins synthesized from butyric aldehyde and propyric aldehyde include Esrek KS-1 and KS-2 (Sekisui Chemical Co., Ltd.).

Two or more polyvinyl acetal is preferably used in an combination.

The polyvinyl acetal resin is preferably used in an amount of at least 50 wt. % of the total amount of the strippable layer to form the matrix of the layer.

The strippable layer preferably contains a fluorine compound in an amount of not less than 1 wt. %.

Examples of the fluorine groups of the fluorine compounds are shown below.

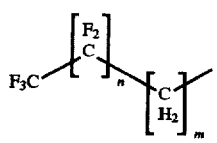

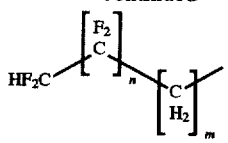

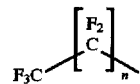

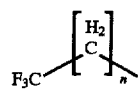

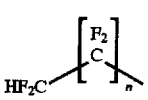

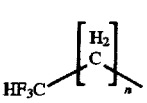

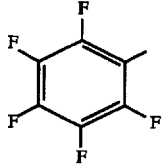

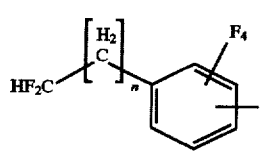

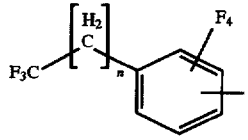

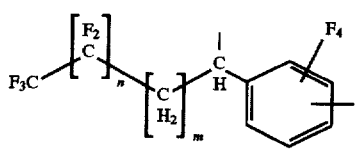

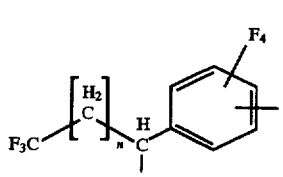

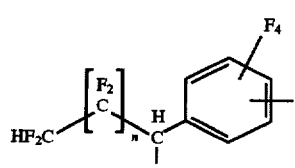

-continued

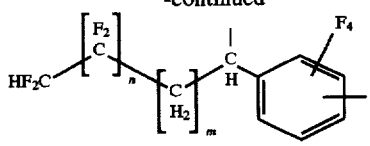
(f13)

In the above formulas, each of n and m independently is a natural number.

Examples of the fluorine compounds are shown below.

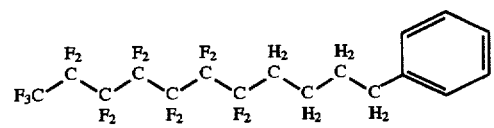
(F1)

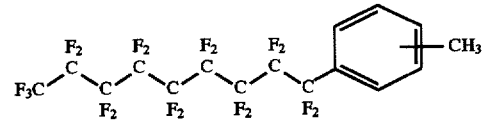
(F2)

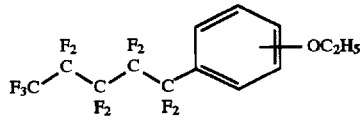
(F3)

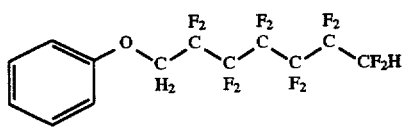
(F4)

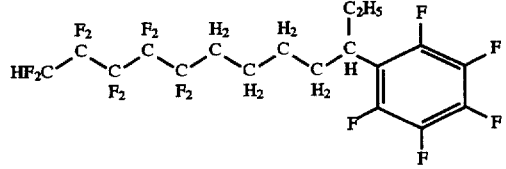
(F5)

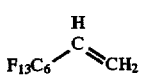
(F6)

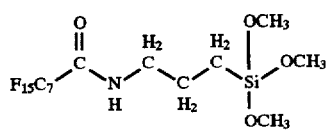
(F7)

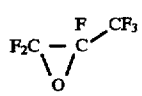
(F8)

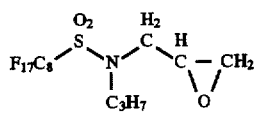
(F9)

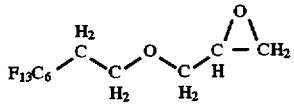
(F10)

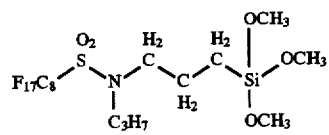
(F11)

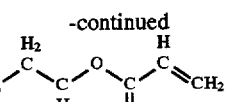
(F12)

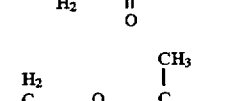
(F13)

Further, polyfluoroethylene is also available as the fluorine compound.

The fluorine compound preferably has a hydrophilic group in addition to the fluorine group. Accordingly, a fluorine surface active agent is advantageously used. The hydrophilic group may be either anionic, cationic, amphoteric or nonionic. The fluorine surface active agent has another function of improving the coating surface of the strippable layer. The fluorine surface active agent is preferably localized along the interface between the support and the strippable layer to improve the strippability of the layer.

Examples of the hydrophilic groups are shown below. The following groups a1 to a7 are anionic groups, c1 to c6 are cationic, and d1 to d4 are amphoteric.

 (a1)

 (a2)

 (a3)

 (a4)

 (a5)

 (a6)

 (a7)

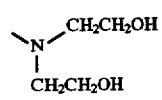 (c1)

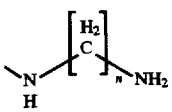 (c2)

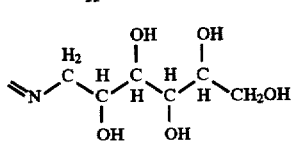 (c3)

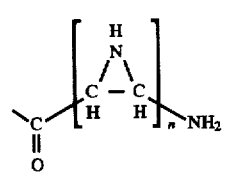 (c4)

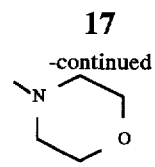 (c5)
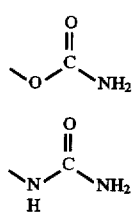 (c6)
(c7)
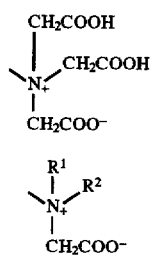 (d1)
(d2)
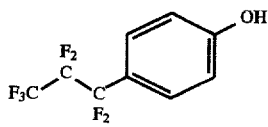 (d3)
(d4)
In the above formulas, each of $R^1$, $R^2$ and $R^3$ independently is an alkyl group or an acyl group, and n is a natural number.
Examples of the nonionic groups include hydroxyl, ketone and carbonyl.
Examples of the fluorine surface active agents having the fluorine group and the hydrophilic group are shown below.
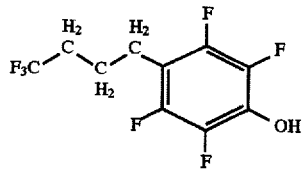 (S1)
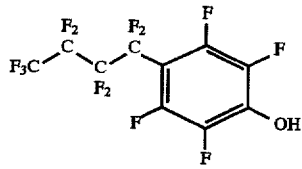 (S2)
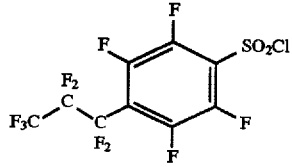 (S3)
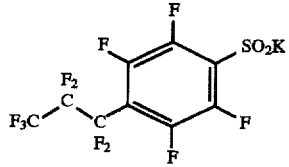 (S4)
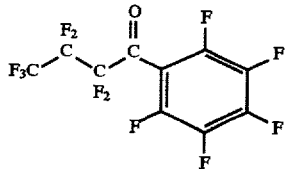 (S5)
(S6)

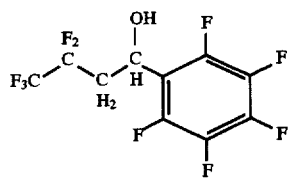

(S7)

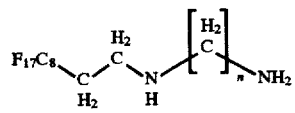

(S8)

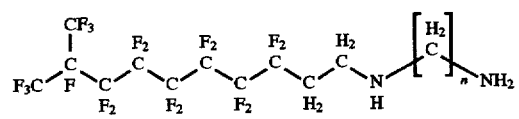

(S9)

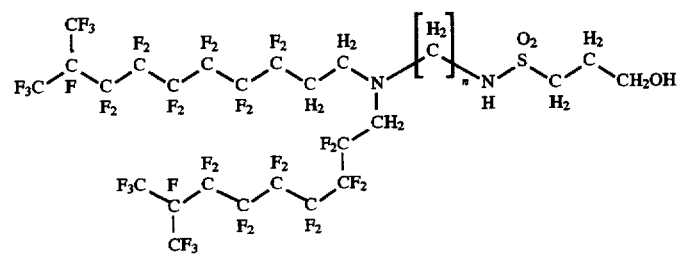

(S10)

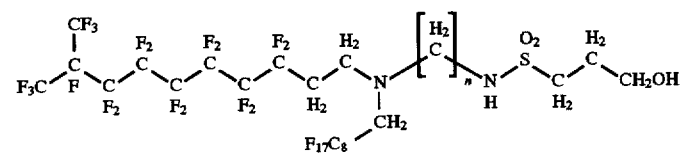

(S11)

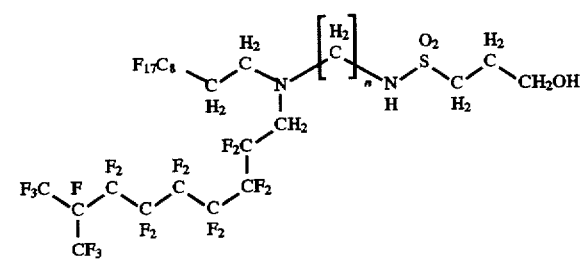

(S12)

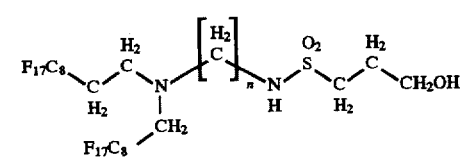

(S13)

In the above formulas, n is 1, 2 or 3.

Another fluorine oligomer or polymer having a surface activating function can also be used in the present invention. The oligomer or polymer can be synthesized by acrylating polyfluoroalkyl alcohol, which is made from polyfluoroethylene.

Various fluorine compounds are commercially available. Examples of the commercial products include Fluorad FC-93, FC-95, FC-98, FC-128, FC-129, FC-135, FX-161, FC-134, FC-170, FC-171, FC-176, FC-430, FC-431, FX-3325, FC-725, FC-721 (Sumitomo 3M Co., Ltd.); Megafac F-110, F-113, F-120, F-141, F-142, F-143, F-144, F-150, F-528, F-171, F-173, F-176, F-177P, F-183, F-184, F-810, F-812, F-824, F-833 (Dai Nippon Printing Co., Ltd.); Defensa MCF-300, MCF-312, MCF-323 (Dai Nippon Printing Co., Ltd.); Surflone S-111, S-112, S-113, F-121, F-131, F-141, F-145, SC-105, SC-101, SC-381, SC-382 (Asahi Glass Co., Ltd.); Modiber F-100, F-102, F-110, F-120, F-130, F-140, F-150, F-200, F-210, F-220, F-250, F-260, F-300, F-310, F-320, F-500, F-600, F-800, F-820, F-840 (Nippon Oils & Fats Co., Ltd.); Aron GF-300, GF-150 (Toagosei Chemical Industry Co., Ltd.); and Futargent 100, 110, 150, 250, 251, 300, 400S (Neos Co., Ltd.).

The fluorine compound can be dissolved or dispersed in the coating solution of the strippable layer. The strippable layer containing the fluorine compound can be prepared by coating and drying the solution on a support.

The amount of the fluorine compound is not smaller than 1 wt. %, and preferably in the range of 2 to 10 wt. %.

The strippable layer may optionally contain other additives, such as a surface active agent, a mold release agent, a modifier or an adhesive agent.

[Support]

There is no specific limitation with respect to the support of the light-sensitive material. Examples of the substances for the support include polyethylene terephthalate, polypropylene, polyethylene, polyvinyl chloride, polystyrene, polycarbonate and cellulose triacetate. A metal such as aluminium can be evaporated on the polymer film to prepare the support. The surface of the support can be treated, for example with a matting agent. The support preferably has a thickness of 50 to 300 µm, and more preferably of 70 to 150 m.

[Silver halide]

Silver halide is silver chloride, silver bromide, silver iodide, silver chlorobromide, silver chloroiodide, silver iodobromide or silver chloroiodobromide in the form of grains.

Various crystal forms of silver halide grains are available. Examples of the grains include a regular crystal form such as hexahedron, octahedron or tetradecahedron, an irregular form such as spherical form or tubular form, a form having crystalline defect such as a twinning plane, and a mixed form thereof.

The silver halide grains may be extremely small grains having a grain diameter (diameter of projected area) of less than 0.01 m, or may be relatively large grains having a diameter of more 10 µm. The silver halide emulsion may be a polydispersed emulsion or a monodispersed emulsion. The monodispersed emulsion is described in U.S. Pat. No. 3,574,628 and U.S. Pat. No. 3,655,394 and U.K. Patent No. 1,413,748.

A tubular silver halide emulsion having an aspect ratio of not less than 5 is also available. The tubular silver halide grains can be easily prepared by processes described in Gutoff, "Photographic Science and Engineering, Vol. 14, pp. 248–257 (1970)", U.S. Pat. No. 4,434,226, U.S. Pat. No. 4,414,310, U.S. Pat. No. 4,433,048 and U.S. Pat. No. 4,439,520, and U.K. Patent No. 2,112,157.

With respect to the crystal structure of the silver halide grains, the individual grains may have a homogeneous halogen composition or a heterogeneous halogen composition in which the composition varies from the outer surface portion to the inside portion. The grains may have a multi-layered structure. Further, the silver halide grains may be bonded with other silver halide grains having different halogen composition through epitaxial bonding. The grains may be bonded with compounds other than the silver halide such as silver rhodanate and lead oxide.

Various substances in the form of salt can be added to the silver halide according to a conventional process at the grain formation or after the grain formation. Examples of the substances include copper, thallium, lead, cadmium, zinc, a chalcogen such as sulfur, selenium and tellurium, gold, and a group III noble metal such as rhodium, iridium, iron, platinum and palladium. The conventional process is described in U.S. Pat. No. 1,195,432, U.S. Pat. No. 1,191,933, U.S. Pat. No. 2,448,060, U.S. Pat. No. 2,628,167, U.S. Pat. No. 2,950,972, U.S. Pat. No. 3,488,709, U.S. Pat. No. 3,737,313, U.S. Pat. No. 3,772,031, U.S. Pat. No. 4,269,927 and "Research Disclosure" (RD), No. 13,452 (June 1975).

In the case that the light-sensitive material is exposed to light in a short time and at a high illumination, iridium ion is preferably added to the silver halide in an amount of $10^{-8}$ to $10^{-3}$ mole, and more preferably in an amount of $10^{-7}$ to $10^{-5}$ mole based on 1 mole of silver halide.

Two or more kinds of silver halide grains which differ in halogen composition, crystal habit, grain size, or other features from each other can be used in combination.

The silver halide is preferably used in the form of an emulsion. The silver halide emulsion can be prepared by a known process, which is described in "Research Disclosure" (RD), No. 17,643, pp. 22–23 (December 1978), (Emulsion preparation and types); and "Research Disclosure", No. 18,716, p. 648, (November 1979).

The silver halide emulsion is generally used after subjecting it to physical ripening, chemical ripening and spectral sensitization. Various additives are used in those stages. The additives are described in "Research Disclosure", No. 17,643 and No. 18,716. The chemical sensitizing agent is described in No. 17,643 (p. 23) and No. 18,716 (p. 648, right side). The spectral sensitizing agent is described in No. 17,643 (pp. 23–24) and No. 18,716 (p. 648, right side). The supersensitizing agent is described in No. 18,716 (p. 649, right side). Other additives are also described in "Research Disclosure". For example, a sensitivity-increasing agent is described in No. 18,716 (p. 648, right side), and an antifogging agent and a stabilizer are described in No. 17,643 (pp. 24–25) and No. 18,716 (p. 649, right side), respectively.

It is preferred to use silver halide grains having a relatively low fogging value.

The silver halide emulsion usually is a negative type. A reversal silver halide emulsion which directly forms a positive image is also available.

[Reducing agent]

The reducing agent has a function of reducing the silver halide or a function of accelerating (or inhibiting) polymerization of the polymerizable compound or the cross-linkable polymer. There are known various reducing agents having the these functions. Examples of the reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the kind or amount of the above reducing agent, the polymerizable compound can be polymerized within the area where a latent image of the silver halide has been formed or, in the alternative, within the area where a latent image of the silver halide has not been formed. For example, the following system (A), (B) or (C) may be employed.

(A) When the reducing agent develops silver halide, the reducing agent itself is oxidized to form an oxidation product. The oxidation product is decomposed in the layer to form a radical. Thus a polymerization reaction proceeds within the area where the latent image of silver halide has been formed. In this system, hydrazines are used as the reducing agent singly or in combination with other reducing agent.

(B) In the case that the oxidation product has a function of inhibiting the polymerization, the polymerization is inhibited within the area where the latent image of silver halide has been formed. The polymerization is caused by a polymerization initiator within the area where the latent image of silver halide has not been formed. In this system, 1-phenyl-3-pyrazolidones are preferably used as the reducing agent.

(C) In the case that the reducing agent itself has a function of inhibiting the polymerization and the oxidation product has no or weak inhibiting function, the polymerization is inhibited within the area where the latent image of silver halide has not been formed. The polymerization is caused by a polymerization initiator within the area where the latent image of silver halide has been formed. In this system, hydroquinones are preferably used as the reducing agent.

In the systems (B) and (C), a polymerization initiator (a thermal polymerization initiator or a photopolymerization initiator) is contained in a layer of the light-sensitive material. The systems (B) and (C) are described in U.S. Pat. No. 4,649,098 and European Patent Publication No. 0202490.

The reducing agents (including compounds referred to as developing agent or hydrazine derivative) are described in Japanese Patent Provisional Publications 61(1986)-183640, No. 61(1986)-183535, No. 61(1986)-228441, No. 62(1987)-70836, No. 61(1987)-86354, No. 62(1987)-86355, No. 62(1987)-206540, No. 62(1987)-264041, No. 62(1987)-109437 and No. 63(1988)-254442, and Japanese Patent Applications No. 63(1988)-97379, No. 63(1988)-296774, No. 63(1988)-296775, No. 1(1989)-27175, No. 1(1989)-54101 and No. 1(1989)-91162. The reducing agents are also described in T. James, "The Theory of the Photographic Process", 4th edition, pp. 291–334 (1977), "Research Disclosure", Vol. 170, No. 17029, pp. 9–15 (June 1978), and "Research Disclosure", Vol. 176, No. 17643, pp. 22–31 (December 1978). Further, there can be also employed a reducing agent precursor capable of releasing a reducing agent under heating or in contact with a base. Also in the light-sensitive material, various reducing agents and reducing agent precursors described in the above publications, applications and literatures can be effectively used. Thus, "the reducing agent" in the present specification means to include all the reducing agents and reducing agent precursors described in the above publications.

When the reducing agent is basic, that is, it forms a salt with an acid, the reducing agent can be used in the form of a salt with an acid. The reducing agents can be used singly or in combination. In the case that two or more reducing agents are used in combination, certain interactions between those reducing agents may be expected. One of the interactions is for an acceleration of reduction of silver halide (or an organic silver salt) through so-called superadditivity. The other interaction is for a chain reaction in which an oxidant of one reducing agent formed by a reduction of silver halide (or an organic silver salt) induced or inhibits the polymerization of the polymerizable compound by oxidation-reduction reaction with other reducing agent. Both interactions may occur simultaneously. Thus, it is difficult to determine which of the interactions has occurred in practical use.

The reducing agent is used in an amount of 0.1 to 10 mole, more preferably 0.5 to 5 mole based on 1 mole of silver halide.

Examples of the reducing agents are described below.

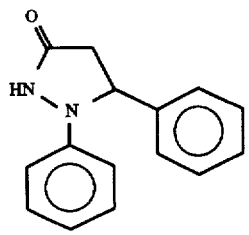
(A)

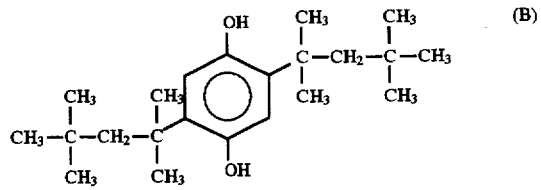
(B)

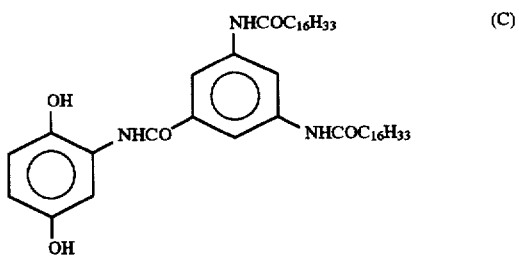
(C)

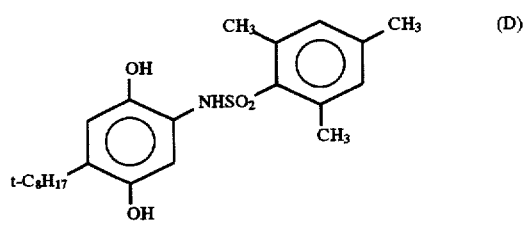
(D)

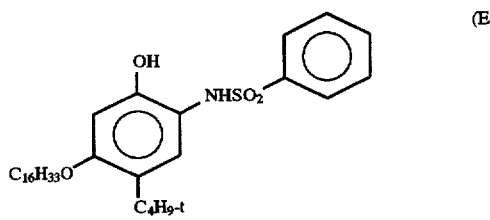
(E)

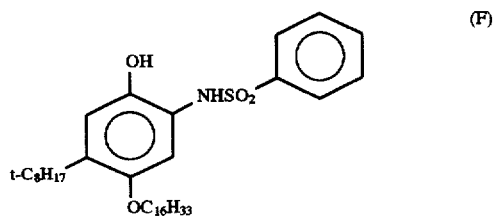
(F)

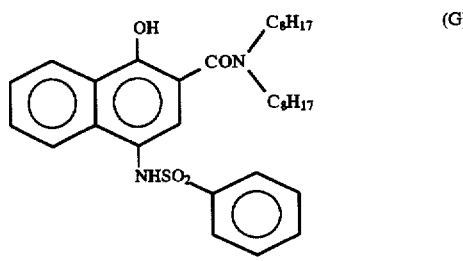
(G)

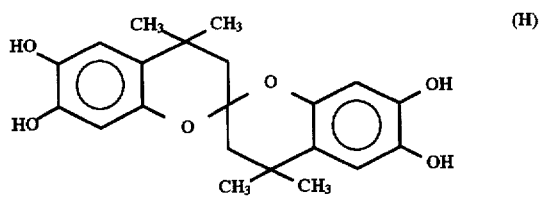
(H)

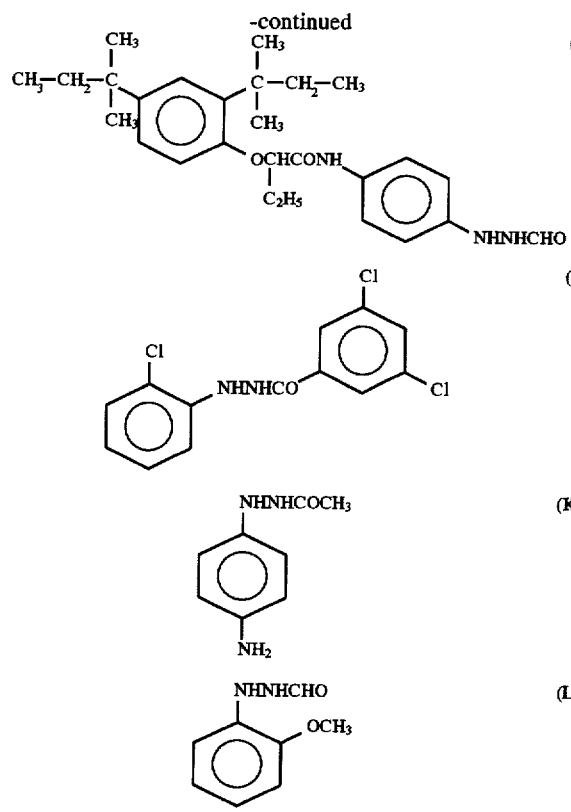

[Polymerizable compound and cross-linkable polymer]

The polymerizable compound used in the present invention has an ethylenic unsaturated group.

Examples of the compounds having an ethylenic unsaturated group include acrylic acids, salts of acrylic acids, acrylic esters, acrylamides, methacrylic acids, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Acrylic esters and methacrylic esters are preferred.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyloxy acrylate, nonylphenyloxyethyl acrylate, 1,3-dioxolane acrylate, hexanediol diacrylate, butanediol diacrylate, neopentyl glycol diacrylate, trimethylolpropane triacrylate, tricyclodecanedimethylol diacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxanediacrylate, 2-(2-hydroxy-1,1-dimethylethyl)-5,5-dihydroxymethyl-1,3-dioxanetriacrylate, triacrylate of propylene oxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentyl glycol dimethacrylate, trimethylolpropane trimethacrylate, pentaerythritol trimethacrylate, pentaerythritol tetramethacrylate and dimethacrylate of polyoxyalkylenated bisphenol A.

The polymerizable compound is commercially available. Examples of the commercially available compounds include Alonix M-309, M-310, M-315, M-400, M-6100, M-8030, M-8100 (trade names, all available from Toagosei Chemical Industry Co., Ltd.) and Kayarad HX-220, HX-620, R-551, TMPTA, D-330, DPHA, DPCA-60, R604, R684 (trade names, all available from Nippon Kayaku Co., Ltd.).

The cross-linkable polymer used in the present invention has a functional group that is reactive to a radical. The polymer may be a homopolymer or a copolymer with a monomer that does not have a reactive group. Examples of the polymer include a polymer having a double bond (ethylenic or another unsaturated bond) in its molecule, a polymer having a polyoxyalkylene unit in its molecule and a polymer containing a halogen atom in its molecule. A polymer that forms a polymer radical by dehalogenatation or dehydrogenation is also available as the cross-linkable polymer. Further, two polymer radicals may be coupled with each other by a cross-linking reaction. Furthermore, a polymer may be cross-linked by a reaction with an ethylenically unsaturated polymerizable compound.

The reactive functional group is contained in the side chain or the main chain. The functional group may be introduced into the side chain by a polymeric reaction of the polymer. The functional group may also be introduced into the side chain by a polymerization of monomers having the group. Examples of the repeating units of the polymer having a functional group in its side chain are shown below.

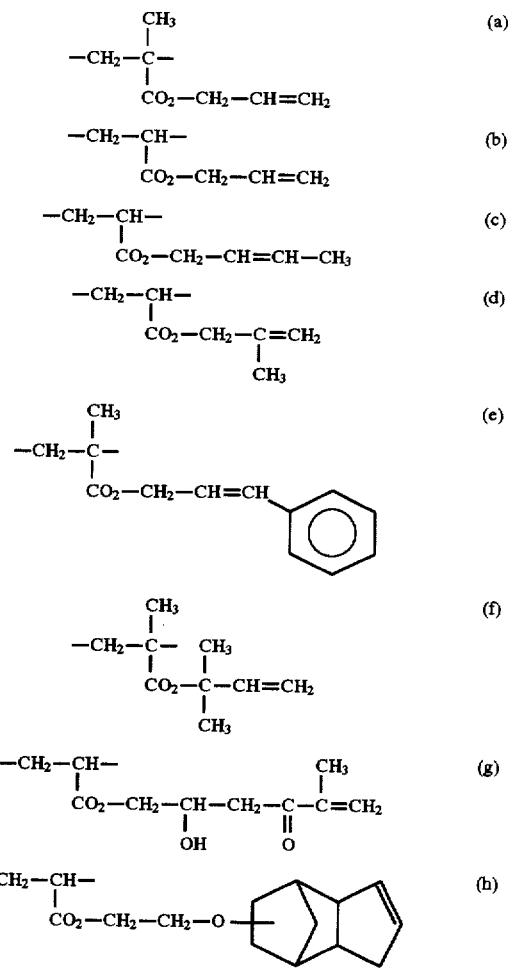

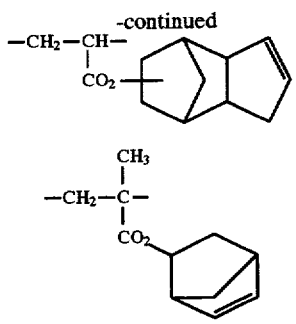

The other examples of the polymers include a synthetic rubber (e.g., polybutadiene, polyisoprene, styrene-isoprene copolymer, styrene-butadiene-acrylonitrile copolymer), a natural rubber, polyethylene oxide, polypropylene oxide, polyvinyl chloride (including a copolymer thereof), polyvinylidene chloride (including a copolymer thereof), polyvinyl acetate (including a copolymer thereof), chlorinated polyethylene, polyvinyl butyral, methyl cellulose, ethyl cellulose and butyl cellulose.

The cross-linkable polymer is described at pages 147 to 192 in "Polymer Reaction" (edited by Polymer Society in Japan, Kyoritsu Shuppan, 1978).

In the case that an alkaline solution is used to remove the unhardened area, the cross-linkable polymer preferably contains an acidic functional group in its molecule. Examples of the acidic functional groups include carboxyl, an acid anhydride group, phenolic hydroxyl, sulfo, sulfonamido and sulfonimido. In the case that a binder of the layer is a polymer made by an addition reaction, the cross-linkable polymer may be a copolymer of a monomer having an cross-linkable group with a monomer having an acidic group. Examples of the monomers include acrylic acid, methacrylic acid, crotonic acid, maleic acid, phthalic acid, maleic anhydride, p-carboxystyrene, p-hydroxystyrene, p-hydroxyphenylacrylamide, hydroxyethyl methacrylate, hydroxyethylmethacrylamide and p-vinylbenzenesulfonic acid.

The polymerizable compound and the cross-linkable polymer can be used singly or in combination of two or more compounds or polymers. Further, a compound formed by bonding a polymerizable functional group such as a vinyl group or a vinylidene group to chemical structure of a reducing agent or a colored substance is also used as the polymerizable compound. A light-sensitive material using a compound that serves as both a reducing agent and a polymerizable compound or both a colored substance and a polymerizable compound can be also included in the embodiments of the light-sensitive material.

The amount of the polymerizable compound and the cross-linkable polymer contained in the polymerizable layer is preferably in the range of 3 to 90% by weight, more preferably in the range of 15 to 60% by weight, based on the whole amount of the polymerizable layer.

[Base and base precursor]

The light-sensitive material may contain a base or base precursor. The base or base precursor is preferably used in the heat development process.

Various organic or inorganic bases and their precursors (e.g., decarboxylation type, thermal decomposition type, reaction type and complex salt-formation type) are available.

Inorganic bases are described in Japanese Patent Provisional Publication No. 62(1987)-209448. Examples of the organic bases include tertiary amine compounds (described in Japanese Patent Provisional Publication No. 62(1987)-170954), bisamidine compounds, trisamidine compounds or tetraamidine compounds (described in Japanese Patent Provisional Publication No. 63(1988)-316760) and bisguanidine compounds, trisguanidine compounds or tetraguanidine compounds (described in Japanese Patent Provisional Publication No. 64(1989)-68746). In the present invention, a base having a pKa value of not less 7 is preferred.

In the present invention, a base precursor is preferred to the base from the viewpoint of the storage stability of the light-sensitive material.

Preferred examples of the base precursors include salts of organic acids with bases that is decarboxylated under heating and urea compounds which release bases under heating. Examples of the reaction mechanisms of the base precursor include a reaction between the base precursor and a salt containing anion having higher compatibility with transition metal acetylide or transition metal ion than acetylide anion, and a reaction of introducing into water both of a basic metallic compound which is hardly dissolved in water and a compound capable of reacting with metal ion of the basic metallic compound in a water medium to form a complex salt so as to release a base through a reaction between those two compounds in the presence of water.

The base precursor preferably releases a base at a temperature in the range of 50° to 200° C., and more preferably in the range of 80° to 160° C.

The light-sensitive material employing a base or a base precursor is described in Japanese Patent Provisional Publication No. 62(1987)-264041. A light-sensitive material employing a tertiary amine as a base is described in Japanese Patent Provisional Publication No. 62(1987)170954. A light-sensitive material employing dispersed grains of a hydrophobic organic base compound having a melting point of 80° to 180° C. is described in Japanese Patent Provisional Publication No. 62(1987)-209523. A light-sensitive material employing a guanidine derivative having a solubility of not more than 0.1% is described in Japanese Patent Provisional Publication No. 63(1988)-70845.

A light-sensitive material employing hydroxides or salts of alkali metals or alkaline earth metals is described in Japanese Patent Provisional Publication No. 62(1987) 209448.

A light-sensitive material employing acetylide compounds as a base precursor is described in Japanese Patent Provisional Publication No. 63(1988)-24242. A light-sensitive material employing a salt of propiolic acid as a base precursor and further containing silver, copper, a silver compound or a copper compound as a catalyst of the base production reaction is described in Japanese Patent Provisional Publication No. 63(1988)-46446. A light-sensitive material containing the salts of propiolic acid under the condition of being separated from the silver, copper, silver compound or copper compound is described in Japanese Patent Provisional Publication No. 63(1988)-81338. A light-sensitive material containing free ligands in addition to the salts of propiolic acid and the silver, copper, silver compound or copper compound is described in Japanese Patent Provisional Publication No. 63(1988)-97942. A light-sensitive material employing salts of the propiolic acid as a base precursor and further containing heat fusible compounds as an accelerator of the base production reaction is described in Japanese Patent Provisional Publication No. 63(1988)-46447. A light-sensitive material employing a salt of sulfonyl acetate as a base precursor and further containing heat fusible compound as an accelerator for the base production reaction is described in Japanese Patent Provisional Publication No. 63(1988)-48453. A light-sensitive material employing compounds in which isocyanate or isothiocyanate is bonded to an organic base is described in Japanese Patent Provisional Publication No. 63(1988)-96652. A light-sensitive material containing a nucleating agent as a decomposition accelerator of the above compound is described in Japanese Patent Provisional Publication No. 63(1988)-173039.

A light-sensitive material employing as a base precursor a bisamidine or trisamidine salt of carboxylic acid capable of being decarboxylated is described in Japanese Patent Provisional Publication No. 64(1989)-9441. A light-sensitive material employing as a base precursor a bisguanidine or trisguanidine salt of carboxylic acid capable of being decarboxylated is described in Japanese Patent Provisional Publication No. 64(1989)-68749.

The base or the base precursor can be used in an amount of preferably 0.5 to 50 mole, and more preferably 1 to 20 mole based on 1 mole of silver halide.

[Colorant]

In the second embodiment of the present invention, a colorant is contained in the light-sensitive material.

The colorant has a function of forming a visible (to human eye) color image (e.g., a color proof). There is no specific limitation on the colorant provided that the colorant does not remarkably inhibit the hardening reaction of the polymerizable compound or the cross-linkable polymer, the sensitivity of silver halide or the developing reaction. Various known pigments and dyes are available.

The pigments are commercially available. Further, pigments are described in various publications such as "Handbook of Color Index," "New Handbook of Pigments," (Nippon Ganryo Gijutsu Kyokai (ed.), 1977), "New Applied Technique of Pigments," (CMC Publishing, 1986), and "Technique of Printing Ink," (CMC Publishing, 1984).

Examples of the pigments include black pigments, yellow pigments, orange pigments, brown pigments, red pigments, violet pigments, blue pigments, green pigments, fluorescent pigments, metal powder pigments and polymer pigments. Concrete examples of the pigments include insoluble azo pigments, azo lake pigments, condensation azo pigments, chelate azo pigments, phthalocyanine pigments, anthraquinone pigments, perylene pigments, perynone pigments, thioindigo pigments, quinacridone pigments, dioxadine pigments, isoindolinone pigments, quinophthalone pigments, dye-type lake pigments, azine pigments, nitroso pigments, nitro pigments, natural pigments, fluorescent pigments and inorganic pigments.

The pigment can be per se used or can be used after being subjected to surface treatment. As the surface treatment, there can be employed a method of coating a resin or wax on the surface of the pigment, a method of depositing a surface active agent thereon, a method of bonding a reactive substance (e.g., silane coupling agent, epoxy compound and polyisocyanate) to the surface of the pigment. Those methods are described, for example, in "Nature and Application of Metal Soap", (Saiwai Shobo), "Technique of Printing Ink", (CMC Publishing, 1984), and "New Applied Technique of Pigments", (CMC Publishing, 1986).

The particle size of the pigment is preferably in the range of 0.01 to 10 μm, more preferably in the range of 0.05 to 1 μm.

The pigment can be introduced into the light-sensitive polymerizable layer (or the polymerizable layer) by adding or dispersing it into a coating solution for the formation of the layer. For dispersing the pigment in the coating solution, various dispersing techniques conventionally used for the preparation of ink or toner can be employed. As the dispersing device, there can be used a sand mill, an attritor, a pearl mill, a super mill, a ball mill, an impeller, a disperser, a KD mill, a colloid mill, a dynatron a three-roll mill and a press kneader. Details of the devices are described in "New Applied Technique of Pigments", (CMC Publishing, 1986).

Dyes are also available as the colorant. The dye, that is, a material being itself colored, there can be used those commercially available and those described in various publications (e.g., "Handbook of Dyes", Yuki Kagaku Kyokai (ed.), 1970). Concrete examples of the dyes include azo dyes, metal complex salt azo dyes, pyrazolone azo dyes, anthraquinone dyes, quinonimine dyes and methine dyes.

The upper limit of the amount of the colorant is determined provided that the colorant does not remarkably inhibit the hardening reaction, the sensitivity of silver halide or the developing reaction. The amount is preferably so determined that the optical density of the formed image is analogous to that of the printed matter. The color density depends on the nature of each of the pigment or dye. The amount is usually in the range of 0.01 to 2 $g/m^2$, and more preferably in the range of 0.02 to 1 $g/m^2$.

Two or more colorants may be used in combination. The hue (absorption spectrum) of the colorant is preferably analogous to that of the printing ink. In the present invention, the pigment is preferred to the dye, since the printing ink usually contains a pigment.

[Binder of polymerizable layer]

A binder may be added to the polymerizable layer of the multi-layered light-sensitive material to enhance the strength of the layer. The binder preferably does not decrease the solubility of the unhardened area of the polymerizable layer in the solvent. The binder also preferably does not increase the solubility of the hardened area in the solvent. Various natural or synthetic polymers are available as the binder. The synthetic polymer can be formed by an addition reaction (of a vinyl monomer) or a condensed reaction. Examples of the synthetic polymers include vinyl polymers (e.g., polystyrene, polyacrylate, polymethacrylate), polyesters, polyamides, polyurethanes, polyester-polyamides and copolymers thereof.

In the case that an alkaline solution is used to remove the unhardened area, the binder preferably contains an acidic functional group in its molecule. Examples of the acidic functional groups include carboxyl, an acid anhydride group, phenolic hydroxyl, sulfo, sulfonamido and sulfonimido. In the case that the binder is a polymer made by an addition reaction, the binder may be a copolymer of a monomer having an cross-linkable group with a monomer having an acidic group. Examples of the monomers include acrylic acid, methacrylic acid, crotonic acid, maleic acid, phthalic acid, maleic anhydride, p-carboxystyrene, p-hydroxystyrene, p-hydroxyphenylacrylamide, hydroxyethyl methacrylate, hydroxyethylmethacrylamide and p-vinylbenzenesulfonic acid.

There is not specific limitation on the amount of the binder so long as the binder does not inhibit the hardening reaction in the polymerizable layer. The amount is usually in the range of 0 to 80% by weight, and preferably in the range of 0 to 70% by weight, based on the whole amount of the polymerizable layer.

[Polymerization inhibitor]

A polymerization inhibitor may be added to the polymerizable layer to prevent the dark reaction. Various known polymerization inhibitors are available. Examples of the polymerization inhibitors include a nitrosamine, a thiourea, a thioamide, a urea compound, a phenol derivative, a nitrobenzene derivative and an amine. Concrete examples include Al salt of cupferron, N-nitrosodiphenylamine, allylthiourea, an aryl phosphate, p-toluidine, φ-toluquinone, nitrobenzene, pyridine, phenathiazine, β-naphthol, naphthylamine, t-butylcatechol, phenothiazine, chloranil, p-methoxyphenol, pyrogallol, hydroquinone and an alkyl or aryl-substituted hydroquinone.

[Organic metallic salt]

An organic metallic salt can be added to the light-sensitive layer containing silver halide. The organic metallic salt relates to an oxidation-reduction reaction at the heat development wherein the latent image of silver halide functions as the catalyst. It is considered that the organic metallic salt has a function of accelerating the oxidation-reduction reaction. The organic silver salt is described in Japanese Patent Provisional Publications No. 59(1984)-55429 and No. 62(1987)-3246.

The metal of the organic salt preferably is silver. The organic moiety of the salt preferably is an aliphatic carboxylic acid, an aromatic carboxylic acid, a thiocarbonyl compound having a mercapto group or s-hydrogen, an acetylene compound and an imino compound.

Examples of the aliphatic carboxylic acids include acetic acid, butyric acid, succinic acid, sebacic acid, adipic acid, oleic acid, linoleic acid, linolenic acid, tartaric acid, palmitic acid, stearic acid, behenic acid and camphoric acid. When the number of the carbon atoms is small, the formed silver salt is unstable. Therefore, the carboxylic acid should contain a relatively large number of the carbon atoms.

Examples of the aromatic carboxylic acids include benzoic acid derivatives, quinolinic acid derivatives, naphthoic acid derivatives, salicylic acid derivatives, gallic acid, tannic acid, phthalic acid, phenylacetic acid derivatives and pyromellitic acid.

Examples of the thiocarbonyl compounds include 3-mercapto-4-phenyl-1,2,4-triazole, 2-mercaptobenzimidazole, 2-mercapto-5-aminothiadiazole, 2-mercaptobenzothiazole, s-alkylthioglycolic acid (the number of the carbon atoms in the alkyl group is in the range of 12 to 22), dithiocarboxylic acids (e.g., dithioacetic acid), thioamides (e.g., thiostearamide), 5-carboxy-1-methyl-2-phenyl-4-thopyridine, mercaptotriazine, 2-mercaptobenzoxazole and 3-amino-5-benzylthio-1,2,4-triazole. The mercapto compounds described in U.S. Pat. No. 4,123,274 are also available.

Examples of the imino compounds include benzotriazole and derivatives thereof, 1,2,4-triazole, 1H-tetrazole, carbazole, saccharin, imidazole and derivatives thereof. Examples of the benzotriazole derivatives include alkyl-substituted benzotriazoles (e.g., methylbenzotriazole), halogen-substituted benzotriazoles (e.g., 5-chlorobenzotriazole), carboimidobenzotriazoles (e.g., butylcarboimidobenzotriazole), nitrobenzotriazoles, sulfobenzotriazoles, carboxybenzotriazoles and salts thereof and hydroxybenzotriazoles. U.S. Pat. No. 4,220,709 describes 1,2,4-triazole and 1H-tetrazole.

A similar effect can be obtained in the case that the organic moiety of the organic metallic salt in place of the salt itself is added to the light-sensitive layer. Two or more organic metallic salts can be used in combination.

The organic silver salt is generally used in an amount of 0 to 10 moles, preferably 0 to 1 mole based on 1 mole of silver halide. The total amount of the silver halide and the organic silver salt contained in the light-sensitive layer is preferably in the range of 1 mg/m² to 5 g/m², more preferably in the range of 10 mg/m² to 0.5 g/m² in terms of silver.

[Binder of light-sensitive layer]

A hydrophilic binder is preferably contained in the light-sensitive layer.

The hydrophilic binder has a hydrophilic group or a hydrophilic bond in its molecule. Examples of the hydrophilic group include carboxyl, hydroxyl (including alcohol and phenol), sulfo, sulfonamido, sulfonimido and amido. Examples of the hydrophilic bond include urethane bond, ether bond and amido bond.

The hydrophilic binder preferably is soluble in water or swells in water. The polymer which swells in water has an affinity to water, but is not soluble in water because of the cross-linking structure of the polymer.

The natural or synthetic polymers can be used as the hydrophilic binder. Examples of the natural hydrophilic polymer include polysaccharide such as starch derivatives, cellulose derivatives, alginic acid, pectic acid, gum arabic and pullulan, and protein such as casein and gelatin. The denatured polymers are also available. In preparation of the light-sensitive material (at the stage of coating or drying), these natural polymers may be denatured or cross-linked. The synthetic hydrophilic polymer is a polymer or copolymer of water-soluble monomers. The water-soluble monomers have a hydrophilic group such as carboxyl, acid anhydride, hydroxyl, sulfo (including a salt thereof), amido, amino and ether. Examples of the monomer are described in "Application and Market of Water-soluble Polymer" (CMC, p. 16–18). A copolymer formed from the above-mentioned monomers by polymerization or cross-linking (cf., copolymers described in U.S. Pat. No. 4,913,998) can also be used.

The other examples of the hydrophilic polymer include polyvinyl alcohol, polyvinyl ether, polyvinyl pyrrolidone and derivatives thereof. Polyvinyl alcohol is particularly preferred.

Polyvinyl alcohol may be denatured by copolymerization with another monomer. A copolymer of vinyl acetate and another monomer is saponified to form the denatured polyvinyl alcohol. Examples of the monomer copolymerized with the vinyl acetate include ethylene, a higher vinyl carboxylate, a higher alkyl vinyl ether, methyl methacrylate and acrylamide. Polyvinyl alcohol may also be denatured after the saponification. Hydroxyl in polyvinyl alcohol can be modified by etheration, esterification or acetylation. A cross-linked polyvinyl alcohol is also available. Examples of the cross-linking agent include aldehyde, methylol compounds, diisocyanate, divinyl compounds, dicarboxylic acids, borates, titanium and copper. The denatured or cross-linked polyvinyl alcohol is described in "Poval" 3rd ed., Kobunshi Kanko-Kai, p. 281–285 and 256–260.

The molecular weight is preferably in the range of 3,000 to 500,000. The hydrophilic polymer binder is preferably used in an amount in the range of 0.05 g to 20 g/m², and more preferably in the range of 0.1 to 10 g/m².

The light-sensitive layer preferably has a function of preventing oxygen from the air to the polymerizable layer at the heat development process. The oxygen functions as a polymerization inhibitor. Therefore, the hydrophilic polymer preferably has a low transmission coefficient of oxygen of not more than $1.0 \times 10^{-11}$ cm³.cm/cm².sec.cmHg.

The examples of the hydrophilic polymer binder having the low transmission coefficient of oxygen include polyvinyl alcohol and its derivatives, gelatin and copolymer of vinylidene chloride. The derivatives of polyvinyl alcohol include the above-mentioned denatured polyvinyl alcohol (formed by saponification of the block copolymer of polyvinyl acetate and another monomer). The molecular weight is preferably in the range of 3,000 to 500,000.

Polyvinyl alcohol preferably has a high saponification degree of not less than 70%, more preferably of not less than 80%, most preferably of not less than 95%. The polyvinyl alcohol having the high saponification degree has a very low transmission coefficient of oxygen.

[Heat development accelerator]

The light-sensitive material can contain a heat development accelerator. The heat development accelerator may be contained in any layers of the light-sensitive material. The function of the heat development accelerator has not yet been analyzed. There are two assumptions. According to one assumption, the heat development accelerator has a function of increasing the plasticity of a polymer (contained in the polymerizable layer or the light-sensitive layer). According to the other assumption, the accelerator has another function of accelerating the dispersion of the components in the layers when it is dissolved by heat of the development process. As a result, the reactions (decomposition of a base precursor, reduction of silver halide and a hardening reaction) at the heat development process are accelerated.

The heat development accelerator has been known as a plasticizer. The known plasticizers are described in "Plastic Additives (written in Japanese)", p. 21–63 (Taisei-sha); Plastics Additives, Second Edition; Hanser Publishers, Chapter 5, p. 251–296; Thermoplastic Additives, Marcel Dekker Inc., Chapter 9, p. 345–379; Plastic Additives, An Industrial Guide, Noyes Publications, Section 14, p. 333–485: The Technology of Solvents and Plasticizers, John Willey & Sons Inc., Chapter 15, p. 9031027; Industrial Plasticizers, Pergamon Press; Plasticizer Technology, Vol. 1, Reinhold Publishing corp.; and Plasticization and Plasticizer Process, American Chemistry.

The heat development accelerator has also been known as a hot-melt solvent. Examples of the hot-melt solvent include polar compounds described in U.S. Pat. No. 3,347,675; 1,10-decandiol, methyl anisate and biphenyl suberate described in "Research Disclosure" pp. 26–28, (December 1976); sulfonamide derivatives; polyethylene glycol derivatives; cyclic amides; aromatic compounds; esters and amides; ethers and thioethers; ketones, carbonates, sulfoxides, phosphonates; and phenols.

Preferred examples of the heat development accelerator include glycols (e.g., diethylene glycol, dipropylene glycol), polyhydric alcohols (e.g., glycerol, butanediol, hexanediol), saccharides, formates, ureas (e.g., urea, diethylurea, ethyleneurea, propyleneurea), a urea resin, a phenol resin, amides (e.g., acetamide, propionamide) and sulfonamides. Two or more heat development accelerators can be used in combination. The heat development accelerators can be added to two or more layers of the light-sensitive material.

The amount of the heat development accelerator is preferably in the range of 0 to 2 g/m$^2$, and more preferably in the range of 0 to 1 g/m$^2$.

[The other additives]

The light-sensitive material can contain the other additives such as an antifogging agent, a silver development accelerator, a development stopping agent, a surface active agent and a dispersing agent.

The antifogging agent, the silver development accelerator and the dispersing agent often have two or more functions. Accordingly, it is difficult to classify these compounds. Examples of these compounds include cyclic amides, polyethylene glycol derivatives, thiol derivatives, acetylene compounds, sulfonamide derivatives and azoles or azaindenes described in "Research Disclosure" pp. 24–25 (1978). These compounds are generally used in an amount of 10$^{-7}$ to 1 mole based on 1 mole of the silver halide.

The development stopping agent can be used in the light-sensitive material to obtain a clear image constantly regardless of the temperature and time for the development process. The development stopping agents are compounds to neutralize a base or react with a base to reduce the base concentration in the layer to stop development, or compounds that mutually react with silver or a silver salt to suppress development, after the appropriate development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and precursors thereof.

[Coloring agent]

A coloring agent can be added to the light-sensitive material as an antihalation agent. Various pigments and dyes are available as the coloring agent provided that the agent does not inhibit the hardening reaction of the polymerizable layer and the sensitivity or the developing reaction of silver halide. Where the coloring agent is used as the antihalation agent, the color of the agent should absorb the light used in the exposing step. Examples of the coloring agent are the same as those of the colorant.

The coloring agent can also be contained in the light-sensitive layer or an adjacent layer thereof as an antiirradiation dye. The antiirradiation dye is described in U.S. Pat. No. 3,697,037, No. 3,423,207, No. 2,865,752, U.K. Patents No. 1,030,392 and No. 1,100,546.

The amount of the coloring agent is determined provided that the colorant does not remarkably inhibit the hardening reaction, the sensitivity of silver halide or the developing reaction. The amount is usually in the range of 0.01 to 2 g/m$^2$, and more preferably in the range of 0.02 to 1 g/m$^2$.

In the second embodiment of the present invention, the coloring agent may disturb the hue of the colorant contained in the polymerizable layer. Therefore, the coloring agent is preferably not used in the second embodiment, or the amount is preferably as small as possible. On the other hand, there is no such problem in the first embodiment using color toner.

The coloring agent can be contained in an optional layer such as a backing layer, an intermediate layer. The coloring agent may also be contained in two or more layers. Two or more coloring agents can be used in combination.

[Polymerization initiator]

In the systems (B) and (C) described at the item of [Reducing agent], a thermal polymerization initiator or a photopolymerization initiator is contained in the light-sensitive material. Various known thermal polymerization initiators and photopolymerization initiators are available. When the photopolymerization initiator is used, the light-sensitive material is uniformly exposed to light after the developing step.

A thermal polymerization initiator is described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds such as azobisisobutyronitrile, 1,1'-azobis(1-cyclohexanecarbonitrile), dimethyl-2,2'-azobisisobutyrate, 2,2'-azobis(2-methylbutyronitrile) and azobisdimethylbaleronitrile; organic peroxides such as benzoyl peroxide, di-t-butyl peroxide, dicumyl peroxide, t-butyl hydroperoxide and cumene hydroperoxide; inorganic peroxides such as hydrogen peroxide, potassium persulfate and ammonium persulfate; and sodium p-toluene-sulfinic acid.

The photopolymerization initiator is described in Oster et al., Chemical Review, vol. 68, p. 125–151 (1968) and Kosar, Light-Sensitive System, p. 158–193, John Willey & Sons (1965). Examples of the photopolymerization initiator include carbonyl compounds (e.g., α-alkoxyphenyl ketches, polycyclic quinones, benzophenone derivatives, xanthones, thioxanthones and benzoines), halogen-containing compounds (e.g., chlorosulfonyl or chloromethyl polynuclear aromatic compounds, chlorosulfonyl or chloromethyl heterocyclic compounds, chlorosulfonyl or chloromethyl benzophenones and fluorenones), haloalkanes, α-halo-α-phenylacetophenones, redox couples of photo-reducible dye and reducing agent, organic sulfur compounds, peroxides, photo semi-conductors (e.g., titanium dioxide and zinc oxide), metallic compounds (e.g., ferrous salt, metallic salt of carbonyl compound, metal complex and uranyl salt), silver halide, azo compounds and diazo compounds.

Concrete examples of the photopolymerization initiators include 2-dimethoxy-2-phenylacetophenone, 2-methyl-[4-(methylthio)phenyl]-2-morpholino-1-propanone, benzoin butyl ether, benzoinisopropyl ether, benzophenone, Michler's ketone, 4,4-diethylaminobenzophenone, chloromethylbenzophenone, chlorosulfonylbenzophenone, 9,10-anthraquinone, 2-methyl-9,10-anthraquinone, chlorosulfonyl anthraquinone, chloromethyl anthraquinone, 9,10-phenanthrenequinone, xanthone, chloroxanthone, thioxanthone, chlorothioxanthone, 2,4-diethylthioxanthone, chlorosulfonylthioxanthone, chloromethylbenzothiazole, chlorosulfonylbenzoxazole, chloromethylquinoline, fluorene and carbon tetrabromide.

Examples of the photo-reducible dyes include methylene blue, thionine, rose bengal, erythrocin-⊖, eosine, rhodamine, phloxin-β, safranine, acryflavine, riboflavine, fluorescein, uranine, benzoflavine, acryzine orange, acryzine yellow and benzanthrone.

Examples of the reducing agents (hydrogen donative compounds) employable with these dyes include β-diketones (e.g., dimedone and acetylacetone), amines (e.g., triethanolamine, diethanolamine, monoethanolamine, diethylamine and triethylamine), sulfinic acids (e.g., p-toluene-sulfinic acid and benzenesulfinic acid), salts of those sulfinic acids, N-phenylgrycine, L-ascorbic acid and salts thereof, thiourea, and allylthiourea.

A molar ratio between the photo-reducible dye and the reducing agent is preferably in the range of 1:0.1 to 1:10.

Also preferably employable as the photopolymerization initiators are commercially available ones such as Irgacure-651® and Irgacure-907® (produced by Ciba-Geigy).

The polymerization initiator is used in an amount of preferably 0.001 to 0.5 g, and more preferably 0.01 to 0.2 g based on 1 g of the polymerizable compound.

[Optional layers]

Optional layers may be added to the single-layered or multi-layered light-sensitive materials. An overcoating layer (or a cover film layer) has a function of protecting the surface of the light-sensitive material or a function of preventing oxygen in the air from inhibiting the polymerization reaction. A backing layer may function as an antihalation layer. The backing layer may also function of preventing adhesion between two light-sensitive materials when they are stocked. An intermediate layer may also function as an antihalation layer. The backing layer may also function of adjusting adhesion between two layers. A layer containing a matting agent may be provided on the surface facing an image receiving material. The matting agent has a function of contacting tightly the light-sensitive material with the image receiving material to prevent bubble formed between the materials. Various known matting agents are available. The matting agent may also be contained in the image receiving material.

An overcoating layer can be prepared by coating a solution of a polymer on a light-sensitive material. The overcoating layer can also be prepared by laminating a polymer film on the light-sensitive material. The overcoating layer may be formed by the lamination just before the image forming method. The hydrophilic binders described at the item of [Binder of the light-sensitive layer] are available as the polymer of the overcoating layer. Polyvinyl alcohols are particularly preferred. The polyvinyl alcohol preferably has a high saponification degree of not less than 85%, and more preferably of not less than 95%. The polyvinyl alcohol having the high saponification degree has a very low transmission coefficient of oxygen. The overcoating layer also functions as a protective layer. The overcoating layer may be peeled from the light-sensitive material just before the laminating step. Two or more overcoating layers may be provided on the light-sensitive material.

EXAMPLE 1

Preparation of light-sensitive material for yellow image formation

A light-sensitive material for yellow image formation (multi-layered light-sensitive material) was prepared in the following manner.

Formation of strippable layer

The following coating solution was coated and dried on a biaxially stretched polyethylene terephthalate film having the thickness of 100 μm to form a strippable layer having the thickness of 2.0 μm.

| Coating solution of strippable layer | Amount |
|---|---|
| Polyvinyl butyral (Denka Butyral 5000-A, Denki Kagaku Kogyo K. K., average polymerization degree: 2,000, butyralation degree: 80 mol % or more, remaining vinyl acetate: 1.5 mol % or less) | 3.75 g |
| Fluorine surface active agent (Megafac F177P, Dai Nippon Printing Co., Ltd.) | 0.07 g |
| Methanol | 37.50 g |
| n-Propanol | 37.50 g |

Preparation of yellow pigment dispersion

The following composition was dispersed at 2,000 rpm for 2 hours using a Dynomill to obtain a yellow pigment dispersion having the average particle size of 0.25 μm.

| Yellow pigment dispersion | Amount |
|---|---|
| Following yellow pigment (C.I.: Pigment Yellow 14) | 30.0 g |
| Allyl methacrylate/methacrylic acid copolymer (copolymerization ratio = 80/20) | 50.0 g |
| Propylene glycol monomethyl ether | 320.0 g |

(Yellow pigment)

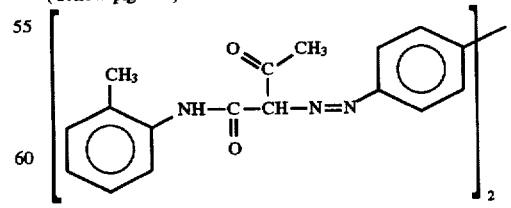

Formation of polymerizable layer

The following coating solution was coated and dried on the strippable layer to form a polymerizable layer having the dry thickness of 1.3 μm.

| Coating solution of polymerizable layer | Amount |
|---|---|
| Dipentaerythritol hexaacrylate | 5.0 g |
| Allyl methacrylate/methacrylic acid copolymer (copolymerization ratio = 80/20) | 10.0 g |
| Yellow pigment dispersion | 40.0 g |
| Reducing agent (J) | 1.0 g |
| Methyl ethyl ketone | 30.0 g |

Preparation of silver halide emulsion

Gelatin, potassium bromide and water were placed in a vessel and kept at 55° C. An appropriate amount of ammonium was added to the vessel. Further, an aqueous solution of silver nitrate and an aqueous solution of potassium bromide containing hexachloroiridate (III) (the molar ratio of iridium to silver is $10^{-7}$ mole) were added to the vessel according to a double jet method while keeping the pAg of 7.60 in the reaction vessel. Potassium iodide was then added to the mixture to prepare a monodispersed silver iodobromide emulsion having the average grain size of 0.25 μm (content of silver iodide: 0.2 mole %). In the emulsion, 98% of the silver halide grains are within the range of ±40% of the average grain size. The emulsion was desalted, and adjusted to pH 6.2 and pAg 8.6. The emulsion was then subjected to gold and sulfur sensitization using sodium thiosulfate and chloroauric acid. Further, 200 ml of methanol solution of the following sensitizing dye (concentration: 2.0 M/l) was added to 1 kg of the emulsion. The mixture was stirred for 15 minutes at 60° C. to prepare a silver halide emulsion.

(Sensitizing dye)

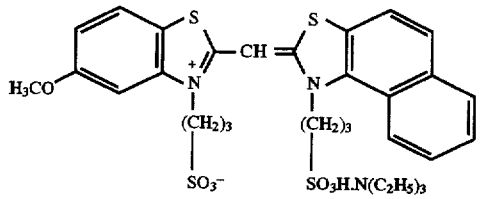

Formation of light-sensitive layer

The following coating solution was coated and dried on the polymerizable layer to form a light-sensitive layer having the dry thickness of about 1.4 μm.

| Coating solution of light-sensitive layer | Amount |
|---|---|
| 10 Wt. % aqueous solution of polyvinyl alcohol (PVA-420 produced by Kuraray Co., Ltd.) | 13.2 g |
| 0.13 Wt. % methanol solution of the following additive (1) | 0.54 g |
| 0.22 Wt. % methanol solution of the following additive (2) | 0.54 g |
| Silver halide emulsion | 0.37 g |
| 5 Wt.% aqueous solution of the following surface active agent | 1.8 g |
| Water | 1.9 g |

(Additive (1))

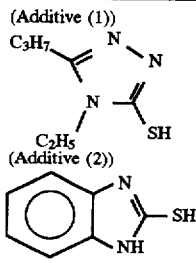

(Additive (2))

(Surface active agent)

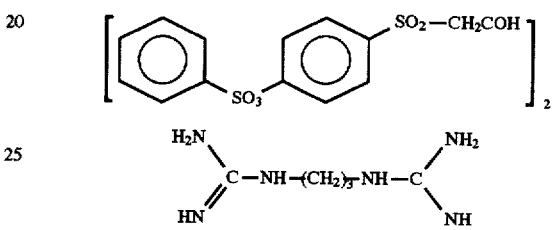

Preparation of base precursor dispersion

In 750 g of 3 wt. % aqueous solution of polyvinyl alcohol was dispersed 250 g of powder of the following base precursor using Dynomill dispersing device. The particle size of the base precursor was about not more than 0.5 μm.

(Base precursor)

Formation of overcoating layer

With 10 wt. % aqueous solution of polyvinyl alcohol having the saponification degree of 88.0% (PVA-205 produced by Kuraray Co., Ltd.) was mixed 6.25 g of the base precursor dispersion and 4 g of 5 wt. % aqueous solution of the surface active agent to prepare a coating solution. The coating solution was coated and dried on the light-sensitive layer to form an overcoating layer having the dry thickness of about 3.0 μm.

EXAMPLE 2

A light-sensitive material was prepared in the same manner as in Example 1, except that the thickness of the strippable layer is changed from 2.0 μm to 1.5 μm.

EXAMPLE 3

A light-sensitive material was prepared in the same manner as in Example 1, except that the thickness of the strippable layer is changed from 2.0 μm to 1.0 μm.

COMPARISON EXAMPLE 1

A light-sensitive material was prepared in the same manner as in Example 1, except that the thickness of the strippable layer is changed from 2.0 μm to 0.5 μm.

COMPARISON EXAMPLE 2

A light-sensitive material was prepared in the same manner as in Example 1, except that the thickness of the strippable layer is changed from 2.0 μm to 0.3 μm.

REFERENCE EXAMPLE 1

Formation of photopolymerizable layer

The following coating solution was coated and dried on the strippable layer prepared in Comparison Example 1 (thickness: 0.5 μm) to form a photopolymerizable layer having the dry thickness of 1.30 μm.

| Coating solution of photopolymerizable layer | Amount |
|---|---|
| Dipentaerythritol hexaacrylate | 5.0 g |
| Allyl methacrylate/methacrylic acid copolymer (copolymerization ratio = 80/20) | 10.0 g |
| Yellow pigment dispersion | 40.0 g |
| Michler's ketone | 0.4 g |
| 2-(o-Chlorophenyl)-4,5-diphenylimidazole dimer | 0.4 g |
| Methyl ethyl ketone | 30.0 g |

Formation of overcoating layer

With 10 wt. % aqueous solution of polyvinyl alcohol having the saponification degree of 88.0% (PVA-205 produced by Kuraray Co., Ltd.) was mixed 4 g of 5 wt. % aqueous solution of the surface active agent used in Example 1 to prepare a coating solution. The coating solution was coated and dried on the photopolymerizable layer to form an overcoating layer having the dry thickness of about 3.0 μm.

REFERENCE EXAMPLE 2

A light-sensitive material was prepared in the same manner as in Reference Example 1, except that the thickness of the strippable layer is changed from 0.5 μm to 0.3 μm.

Evaluation of strippability

With respect to the light-sensitive materials prepared in Examples 1 to 3, Comparison Examples 1 & 2 and Reference Examples 1 & 2, the optimum exposure was determined. The optimum exposure of the materials of Examples 1 to 3 and Comparison Examples 1 & 2 was 3 μJ/cm$^2$ on the light-sensitive surface by using light through a band pass filter of 500 nm (half-width: 50 nm). The optimum exposure of the materials of Reference Examples 1 & 2 was 80 counts by using an ultraviolet exposure apparatus (Dainippon Screen Co., Ltd.).

The light-sensitive materials prepared in Examples 1 to 3 and Comparison Examples 1 & 2 were cut into pieces (width: 4.5 cm, length: 12 cm), and were exposed to light at the above-described optimum exposure. The light-sensitive materials were heated from the support on a hot plate at 140° C. while pressing a polyethylene terephthalate film (thickness: 75 μm) on the overcoating layer. Thus silver halide is developed, and the polymerizable layer is hardened. The light-sensitive material was then washed with water to remove the light-sensitive layer and the overcoating layer. The polymerizable layer was immersed for 30 seconds in an alkaline solution, which was prepared by diluting DN-3C (Fuji Photo Film Co., Ltd) three times with water. The material was dried at room temperature. The polymerizable layer was not dissolved in the alkaline solution because the layer was hardened (exposed sample).

Further, the unexposed sample was heated, washed with water, immersed in the alkaline solution for 30 seconds, and dried at room temperature in the same manner. The polymerizable layer was dissolved in the alkaline solution because the layer was not hardened. Thus, only the strippable layer remained on the support (unexposed sample). Thus, the exposed and unexposed samples were prepared with respect to each of the light-sensitive materials.

With respect to the light-sensitive materials prepared in Reference Examples 1 & 2, the exposed and unexposed samples were prepared. The exposed sample was irradiated with an ultraviolet light. The samples were washed with water to remove the overcoating layer, and immersed in the alkaline solution. The hardened photopolymerizable layer remained on the exposed sample. On the other hand, only the strippable layer remained on the unexposed sample.

An adhesive Maylar tape was attached on the surface of each of the samples. The samples were set in a friction pull tester (Tennsilon UtM-II-20, Orientech Co., Ltd.). The strippability was tested at the direction of 180° to measure the force required for peeling the strippable layer from the support FIG. 11 is a sectional view schematically illustrating a method of measuring strippability.

Figure 11:
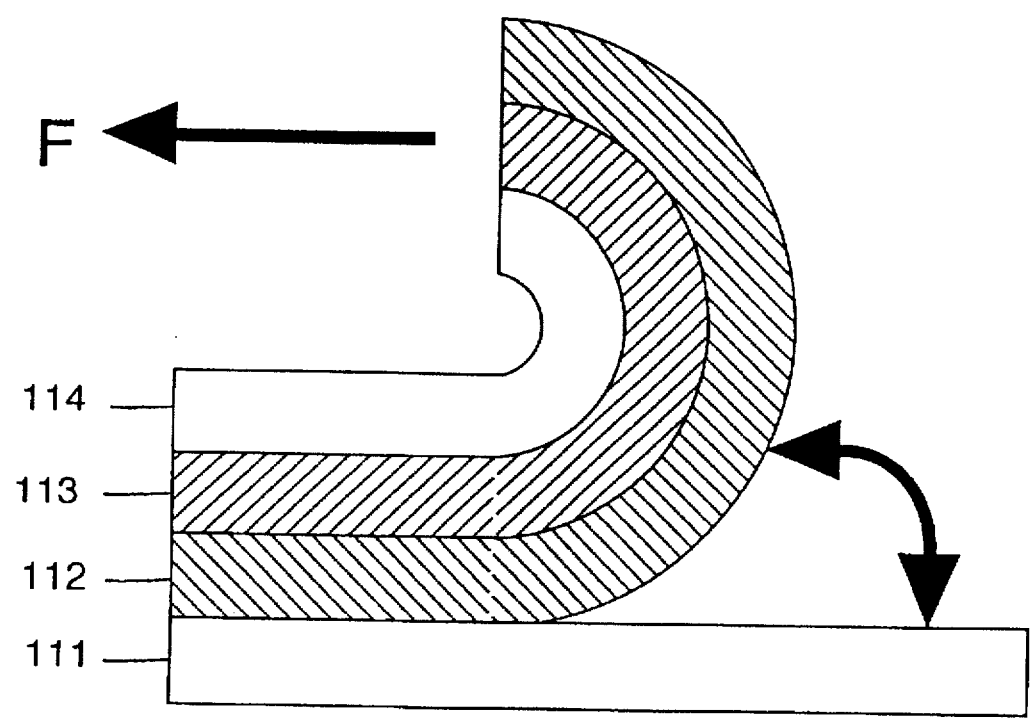
FIG. 11 is a sectional view schematically illustrating a method of measuring strippability.

As is shown in FIG. 11, a Maylar tape (114) is attached on the surface of the polymerizable layer (113) of the light-sensitive material. The strippable layer (112) is peeled from the support (111) by the force (F) at the direction of 180°. The results are set forth in Table 1.

Next, the light-sensitive materials were imagewise exposed to light through a lith film under the optimum conditions as is described above. The materials were then developed as is described above to prepare samples having hardened images. The samples were placed in contact with an image receiving surface of an image receiving material (image receiving sheet CR-T3, Fuji Photo Film Co., Ltd.) while heating by using a laminator (Laminator CA-600T, Fuji Photo Film Co., Ltd.). Then the support of the light-sensitive material was removed to transfer the image to the image receiving material. The transferred image was evaluated with naked eyes. The results are set forth in Table 1.

TABLE 1

| Light-sensitive Material | Strippable layer Thickness | Force required for peeling the layer | | Transferred Image |
|---|---|---|---|---|
| | | Unexposed | Exposed | |
| Example 1 | 2.0 μm | 11 g | 10 g | Good |
| Example 2 | 1.5 μm | 12 g | 11 g | Good |
| Example 3 | 1.0 μm | 13 g | 120 g | Good |
| Com. Ex. 1 | 0.5 μm | 12 g | >1,000 g | Bad |
| Com. Ex. 2 | 0.3 μm | 14 g | >1,000 g | Bad |
| Ref. Ex. 1 | 0.5 μm | 13 g | 13 g | Good |
| Ref. Ex. 2 | 0.3 μm | 13 g | 12 g | Good |

As is evident from the results shown in Table 1, the light-sensitive materials of Reference Examples 1 & 2 using a photopolymerization initiator do not require a large force for peeling the strippable layer. The values of the unexposed and exposed samples are substantially identical.

On the other hand, the exposed samples of Comparison Examples 1 & 2 using silver halide requires a very large force for peeling the layer. This problem is solved by using a thick strippable layer, as is shown in Examples 1 to 3.

Further, the light-sensitive materials of Reference Examples 1 & 2 form a good transferred image. On the other hand, only the unexposed area of the samples of Comparison Examples 1 & 2 was transferred, while the exposed area was not transferred. Therefore, Comparison Examples 1 & 2 do not form a transferred image. This problem is also solved by using a thick strippable layer, as is shown in Examples 1 to 3.

EXAMPLES 4–6

The light-sensitive materials were prepared in the same manner as in Examples 1–3, except that the matrix of the strippable layer is changed from Denka Butyral 5000-A to Esrek BH-3 (polyvinyl butyral, Sekisui Chemical Co., Ltd.).

COMPARISON EXAMPLES 3 & 4

The light-sensitive materials were prepared in the same manner as in Comparison Examples 1 & 2, except that the matrix of the strippable layer is changed from Denka Butyral 5000-A to Esrek BH-3 (polyvinyl butyral, Sekisui Chemical Co., Ltd.).

REFERENCE EXAMPLES 3 & 4

The light-sensitive materials were prepared in the same manner as in Reference Examples 1 & 2, except that the matrix of the strippable layer is changed from Denka Butyral 5000-A to Esrek BH-3 (polyvinyl butyral, Sekisui Chemical Co., Ltd.).

Evaluation of strippability

The light-sensitive materials prepared in Examples 4 to 6, Comparison Examples 3 & 4 and Reference Examples 3 & 4 were evaluated in the same manner as in Examples 1 to 3, Comparison Examples 1 & 2 and Reference Examples 1 & 2. The results are set forth in Table 2.

TABLE 2

| Light-sensitive Material | Strippable layer Thickness | Force required for Peeling the layer | | Transferred Image |
|---|---|---|---|---|
| | | Unexposed | Exposed | |
| Example 4 | 2.0 μm | 11 g | 11 g | Good |
| Example 5 | 1.5 μm | 12 g | 12 g | Good |
| Example 6 | 1.0 μm | 12 g | 240 g | Good |
| Com. Ex. 3 | 0.5 μm | 12 g | >1,000 g | Bad |
| Com. Ex. 4 | 0.3 μm | 11 g | >1,000 g | Bad |
| Ref. Ex. 3 | 0.5 μm | 11 g | 12 g | Good |
| Ref. Ex. 4 | 0.3 μm | 12 g | 11 g | Good |

As is evident from the results shown in Table 2, the light-sensitive materials of Reference Examples 3 & 4 using a photopolymerization initiator do not require a large force for peeling the strippable layer. The values of the unexposed and exposed samples are substantially identical.

On the other hand, the exposed samples of Comparison Examples 3 & 4 using silver halide requires a very large force for peeling the layer. This problem is solved by using a thick strippable layer, as is shown in Examples 4 to 6.

Further, the light-sensitive materials of Reference Examples 3 & 4 form a good transferred image. On the other hand, only the unexposed area of the samples of Comparison Examples 3 & 4 was transferred, while the exposed area was not transferred. Therefore, Comparison Examples 3 & 4 do not form a transferred image. This problem is also solved by using a thick strippable layer, as is shown in Examples 4 to 6.

EXAMPLE 7

Preparation of light-sensitive materials for black, cyan and magenta image formations Light-sensitive materials for black, cyan and magenta image formations (multi-layered light-sensitive material) were prepared in the same manner as in the preparation of the material for yellow image formation of Example 5, except that the black pigment (Carbon Black, C.I. Pigment Black 7) and the following pigments were used in place of the yellow pigment.

(Cyan pigment)

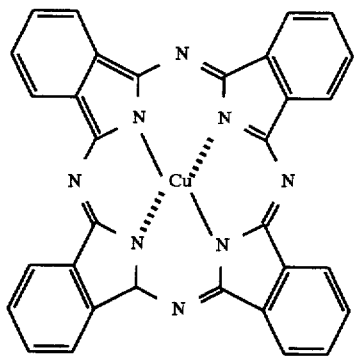

(Magenta pigment)

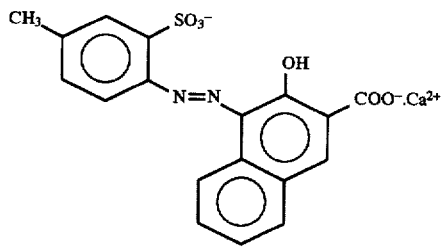

Formation of color Proof

A color proof was formed using the above-prepared multi-layered light-sensitive materials according to the second embodiment of the present invention.

The light-sensitive material for black image formation was imagewise (for black image) exposed to light of 488 nm by a scanning exposure (light source: air cooling argon ion laser). The surface exposure was 3 μJ/cm². The light-sensitive material was heated for 40 seconds from the support on a hot plate at 140° C. while pressing a polyethylene terephthalate film on the overcoating layer having thickness of 75 μm. The light-sensitive material was washed with water to remove the light-sensitive layer and the overcoating layer. The polymerizable layer was immersed for 30 seconds in an alkaline solution, which was prepared by diluting DN-3C (Fuji Photo Film Co., Ltd) three times with water. The light-sensitive material was washed with water and dried at room temperature. Thus, a black hardened replica image was formed on the strippable layer.

The light-sensitive material having the black image was placed in contact with an image receiving material (image receiving sheet CR-T3, Fuji Photo Film Co., Ltd.) while heating by using a laminator (Laminator CA-600T, Fuji Photo Film Co., Ltd.). Then the support of the light-sensitive material was removed to transfer the black image to the image receiving material.

A cyan image was formed on the light-sensitive material in the same manner as in the formation of the black image. The cyan image was transferred on the image receiving material to which the black image had been transferred.

A magenta image was also formed on the light-sensitive material in the same manner as in the formation of the black image. The magenta image was transferred on the image receiving material to which the black and cyan images had been transferred.

A yellow image was further formed on the light-sensitive material (prepared in Example 5) in the same manner as in the formation of the black image. The yellow image was transferred on the image receiving material to which the black, cyan and magenta images had been transferred. Thus a multi-color image was formed on the image receiving material.

The image receiving material was placed in contact with an art paper while heating by using a laminator (Laminator CA-600T, Fuji Photo Film Co., Ltd.). Then the support of the image receiving material was removed to transfer the color image to the art paper. The image quality of the color proof was excellent, and the digital image data were fully reproduced in the color proof.

EXAMPLE 8

Preparation of light-sensitive material

A light-sensitive material (multi-layered light-sensitive material) was prepared in the following manner.

Formation of strippable layer

The following coating solution was coated and dried on a biaxially stretched polyethylene terephthalate film having the thickness of 100 μm to form a strippable layer having the thickness of 2.4 μm.

| Coating solution of strippable layer | Amount |
| --- | --- |
| Polyamide resin (Daiamide 452, Daicel Co., Ltd.) | 3.75 g |
| Fluorine surface active agent (Megafac F177P, Dai Nippon Printing Co., Ltd.) | 0.07 g |
| Methanol | 37.50 g |
| n-Propanol | 37.50 g |

Formation of polymerizable layer

The following coating solution was coated and dried on the strippable layer to form a polymerizable layer having the dry thickness of 1.3 μm.

| Coating solution of polymerizable layer | Amount |
| --- | --- |
| Dipentaerythritol hexaacrylate | 5.0 g |
| Diacrylic ester monomer (A-600, Shin-Nakamura Chemical K.K.) | 5.0 g |
| Allyl methacrylate/methacrylic acid copolymer (copolymerization ratio = 80/20) | 10.0 g |
| Reducing agent (J) | 1.0 g |
| Methyl ethyl ketone | 70.0 g |

Formation of light-sensitive layer

A light-sensitive layer having the dry thickness of 1.3 μm was formed on the polymerizable layer in the same manner as in Example 1.

Formation of overcoating layer

An overcoating layer having the dry thickness of 3.5 μm was formed on the light-sensitive layer in the same manner as in Example 1.

Preparation of yellow toner

Yellow toner was prepared by using the following composition.

| Yellow toner | Amount |
| --- | --- |
| Pigment Yellow 74 (C.I.: #11741) | 4380.0 g |
| Cellulose acetate | 6538.0 g |
| Acetone | 27669.6 g |
| Water | 22680.0 g |
| Dimethyl polysiloxane | (1253.0 g based on 11 kg of toner) |

Water was well mixed with acetone, and the mixture was placed in a ball mill. The mill contains stainless balls having the diameter of 0.049 cm, which are stirred at 150 rpm. The mixture was prepared under an atmosphere of nitrogen. About ⅔ part of the subject weight of cellulose acetate was added to the mill over 3 to 5 minutes. The mixture was further stirred for about 2 minutes. The pigment was added to the mixture over 2 minutes. The remaining cellulose acetate was then added to the mixture.

The resulting mixture was further stirred at 150 rpm for 4 hours. The contents were washed with water and filtered out. The wet toner was collected, washed with water, dried in an oven at 115° to 125° C., and powdered in a hammer mill. The toner was mixed with dimethyl polysiloxane in a blender to treat the surface of the toner.

The toner was further mixed and treated with beads of ionized hydrocarbon copolymer having the average particle size of 23 μm (the same amount as that of the toner) in a desk blender.

Preparation of magenta toner

Magenta toner was prepared in the same manner as in preparation of yellow toner except that the following composition was used and the stirring time was changed from 4 hours to 6 hours.

| Magenta toner | Amount |
| --- | --- |
| Pigment Red 122 (Quidomagenta) | 3315.0 g |
| Pigment Red 123 (C.I. #71145) | 1560.0 g |
| Cellulose acetate | 6929.0 g |
| Acetone | 27669.6 g |
| Water | 22680.0 g |
| Dimethyl polysiloxane | (1679.0 g based on 11.8 kg of toner) |

Preparation of cyan toner

Cyan toner was prepared in the same manner as in preparation of yellow toner except that the following composition was used and the stirring time was changed from 4 hours to 6 hours.

| Cyan toner | Amount |
| --- | --- |
| Copper phthalocyanine (Pigment Blue 15, C.I.: #74160) | 1064.0 g |
| Pigment Green 7 (C.I. #74260) | 943.0 g |
| Cellulose acetate | 7981.0 g |
| Acetone | 27669.6 g |
| Water | 22680.0 g |
| Dimethyl polysiloxane | (574.9 g based on 10 kg of toner) |

Preparation of black toner

Black toner was prepared in the same manner as in preparation of yellow toner except that the following composition was used and the stirring time was changed from 4 hours to 6 hours.

| Black toner | Amount |
| --- | --- |
| Carbon black (Pigment Black 7, C.I.: #77266) | 6300.0 g |
| Cellulose acetate | 6300.0 g |
| Acetone | 27669.6 g |
| Water | 22680.0 g |
| Dimethyl polysiloxane | (970.0 g based on 12.6 kg of toner) |

Formation of color proof

A color proof was formed using the above-prepared light-sensitive material according to the first embodiment of the present invention.

The light-sensitive material was imagewise (for yellow image) exposed to light of 488 nm by a scanning exposure (light source: air cooling argon ion laser). The surface exposure was 10 μJ/cm². The light-sensitive material was heated for 40 seconds on a hot plate at 130° C. The overcoating layer and the light-sensitive layer were then peeled from the light-sensitive material. Thus the developed polymerizable layer was exposed. The yellow toner was applied to the surface of the polymerizable layer while rubbing the surface. The toner was attached to the unexposed (unhardened) area. Thus a yellow color image was formed on the light-sensitive material.

A magenta image was formed on the light-sensitive material in the same manner as in the formation of the yellow image except that the magenta toner was used.

A cyan image was also formed on the light-sensitive material in the same manner as in the formation of the yellow image except that the cyan toner was used.

A black image was further formed on the light-sensitive material in the same manner as in the formation of the yellow image except that the black toner was used.

The light-sensitive material having the yellow image was placed in contact with an art paper (image receiving material), and heated about at 100° C. to transfer the yellow toner with the polymerizable layer and the strippable layer from the light-sensitive material to the image receiving material. The magenta image was then transferred from the light-sensitive material to the image receiving material to which the yellow image had been transferred. The cyan image and the black image were transferred to the image receiving material in the same manner to form a color image on the image receiving material. The image quality of the color proof was excellent, and the digital image data were fully reproduced in the color proof.

EXAMPLE 9

A light-sensitive material was prepared in the same manner as in Example 5, except that the matrix of the strippable layer was changed from Esrek BH-3 to Esrek BX-1 (polyvinyl butyral, Sekisui Chemical Co., Ltd.).

EXAMPLE 10

A light-sensitive material was prepared in the same manner as in Example 5, except that the matrix of the strippable layer was changed from Esrek BH-3 to styrene/α-methylstyrene/acrylonitrile copolymer, the strippable layer contains 2 wt. % of a fluorine surface active agent (Megafac F177P), and the thickness of the strippable layer was 1.8 μm.

EXAMPLE 11

A light-sensitive material was prepared in the same manner as in Example 5, except that the matrix of the strippable layer was changed from Esrek BH-3 to ethylene/ethyl acrylate copolymer, the strippable layer contains 2 wt. % of a fluorine surface active agent (Megafac F177P), and the thickness of the strippable layer was 2.0 μm.

EXAMPLE 12

A light-sensitive material was prepared in the same manner as in Example 5, except that the matrix of the strippable layer was changed from Esrek BH-3 to Esrek BL-1 (polyvinyl butyral, Sekisui Chemical Co., Ltd.).

EXAMPLE 13

A light-sensitive material was prepared in the same manner as in Example 5, except that the matrix of the strippable layer was changed from Esrek BH-3 to Esrek BM-1 (polyvinyl butyral, Sekisui Chemical Co., Ltd.).

REFERENCE EXAMPLE 5

A light-sensitive material was prepared in the same manner as in Reference Example 3, except that the matrix of the strippable layer was changed from Esrek BH-3 to Esrek BL-1 (polyvinyl butyral, Sekisui Chemical Co., Ltd.), and the thickness of the strippable layer was 1.5 μm.

REFERENCE EXAMPLE 6

A light-sensitive material was prepared in the same manner as in Reference Example 5, except that the matrix of the strippable layer was changed from Esrek BH-3 to Esrek BM-1 (polyvinyl butyral, Sekisui Chemical Co., Ltd.).

Measurement of flow softening point

The flow softening point of the matrix of the strippable layer was measured at the pressure of 100 kg/cm² and at the increasing rate of the temperature of 6° C./min by using a nozzle of 1 mm φ×10 m according to a high chemical flow testing method. The results are set forth in Table 3.

Evaluation of strippability

The light-sensitive materials prepared in Examples 5 & 9 to 13 and Reference Examples 5 & 6 were evaluated in the same manner as in Examples 1 to 3, Comparison Examples 1 & 2 and Reference Examples 1 & 2. The results are set forth in Table 3.

TABLE 3

| Light-sensitive Material | Flow softening Point | Force required for peeling the layer | | Transferred Image |
|---|---|---|---|---|
| | | Unexposed | Exposed | |
| Example 5 | 205° C. | 12 g | 12 g | Good |
| Example 9 | 225° C. | 11 g | 20 g | Good |
| Example 10 | 160° C. | 14 g | 11 g | Good |
| Example 11 | 165° C. | 17 g | 30 g | Good |
| Example 12 | 105° C. | 15 g | >1,000 g | Bad |
| Example 43 | 130° C. | 15 g | >1,000 g | Bad |
| Ref. Ex. 5 | 105° C. | 14 g | 12 g | Good |
| Ref. Ex. 6 | 130° C. | 13 g | 13 g | Good |

As is evident from the results shown in Table 3, the light-sensitive materials of Reference Examples 5 & 6 using a photopolymerization initiator do not require a large force for peeling the strippable layer. The values of the unexposed and exposed samples are substantially identical.

On the other hand, the exposed samples of Examples 12 & 13 using silver halide requires a very large force for peeling the layer. This problem is solved by adjusting the flow softening point of the strippable layer matrix, as is shown in Examples 7 & 9 to 11.

Further, the light-sensitive materials of Reference Examples 5 & 6 form a good transferred image. On the other hand, only the unexposed area of the samples of Examples 12 & 13 was transferred, while the exposed area was not transferred. Therefore, Examples 12 & 13 do not form a clear transferred image. This problem is also solved by adjusting the flow softening point of the strippable layer matrix, as is shown in Examples 7 & 9 to 11.

EXAMPLE 14

Light-sensitive materials for black, cyan and magenta image formation were prepared in the same manner as in Example 9, except that the black, cyan and magenta pigments used in Example 7 were used in place of the yellow pigment.

A color proof was prepared in the same manner as in Example 7 using the above-prepared light-sensitive materials and the light-sensitive material for yellow image formation prepared in Example 9. The image quality of the color proof was excellent, and the digital image data were fully reproduced in the color proof.

EXAMPLE 15

Preparation of light-sensitive material

A light-sensitive material (multi-layered light-sensitive material) was prepared in the following manner.

Formation of strippable layer

The following coating solution was coated and dried on a biaxially stretched polyethylene terephthalate film having the thickness of 100 μm to form a strippable layer having the thickness of 1.7 μm.

| Coating solution of strippable layer | Amount |
|---|---|
| Polyvinyl butyral (Esrek BX-5, Sekisui Chemical Co., Ltd., flow softening point: 230° C.) | 3.75 g |
| Fluorine surface active agent (Megafac F177P, Dai Nippon Printing Co., Ltd.) | 0.07 g |
| Methanol | 37.50 g |
| n-Propanol | 37.50 g |

Formation of polymerizable layer

A polymerizable layer having the dry thickness of 1.3 μm was formed on the strippable layer in the same manner as in Example 8.

Formation of light-sensitive layer

A light-sensitive layer having the dry thickness of 1.3 μm was formed on the polymerizable layer in the same manner as in Example 1.

Formation of overcoating layer

An overcoating layer having the dry thickness of 3.5 μm was formed on the light-sensitive layer in the same manner as in Example 1.

A color proof was prepared in the same manner as in Example 8 using the above-prepared light-sensitive material. The image quality of the color proof was excellent, and the digital image data were fully reproduced in the color proof.

EXAMPLE 16

A light-sensitive material was prepared in the same manner as in Example 2, except that the amount of the fluorine surface active agent (Megafac F177P) was changed from 0.07 g to 0.04 g. The amount of the fluorine surface active agent is 1 wt. % of the strippable layer.

EXAMPLE 17

A light-sensitive material was prepared in the same manner as in Example 16, except that the fluorine surface active agent was not used.

EXAMPLE 18

A light-sensitive material was prepared in the same manner as in Example 16, except that a surface active agent containing no fluorine (Aron A-20, LL, Toagosei Chemical Industry Co., Ltd.) was used in the amount of 1.3 wt. % of the strippable layer in place of the fluorine surface active agent (Megafac F177P).

EXAMPLE 19

A light-sensitive material was prepared in the same manner as in Example 16, except that the amount of the fluorine surface active agent (Megafac F177P) was change from 1 wt. % to 0.5 wt. %.

EXAMPLE 20

A light-sensitive material was prepared in the same manner as in Example 16, except that the fluorine surface active agent was change from Megafac F177P (1 wt. %) to Fluorad FC-430 (1.5 wt. %).

EXAMPLE 21

A light-sensitive material was prepared in the same manner as in Example 16, except that the fluorine surface active agent was change from Megafac F177P (1 wt. %) to Megafac FC-176 (1.4 wt. %).

EXAMPLE 22

A light-sensitive material was prepared in the same manner as in Example 16, except that the fluorine surface active agent was change from Megafac F177P (1 wt. %) to Surflone S-113 (1.3 wt. %).

Evaluation of strippability

The light-sensitive materials prepared in Examples 16 to 22 were evaluated in the same manner as in Examples 1 to 3, Comparison Examples 1 & 2 and Reference Examples 1 & 2. The results are set forth in Table 4.

TABLE 4

| Light-sensitive Material | Force required for peeling the layer | | Transferred Image |
|---|---|---|---|
| | Unexposed | Exposed | |
| Example 16 | 13 g | 12 g | Good |
| Example 17 | 450 g | 600 g | Bad |
| Example 18 | 420 g | 570 g | Bad |
| Example 19 | 410 g | 550 g | Bad |
| Example 20 | 12 g | 13 g | Good |
| Example 21 | 11 g | 14 g | Good |
| Example 22 | 11 g | 12 g | Good |

As is evident from the results shown in Table 4, the samples of Examples 17 to 19 require a large force for peeling the strippable layer. Therefore, Examples 17 to 19 do not form a clear transferred image. This problem is also solved by using a fluorine compound, as is shown in Examples 16 & 20–22.

EXAMPLE 23

Light-sensitive materials for black, cyan and magenta image formation were prepared in the same manner as in Example 16, except that the black, cyan and magenta pigments used in Example 7 were used in place of the yellow pigment.

A color proof was prepared in the same manner as in Example 7 using the above-prepared light-sensitive materials and the light-sensitive material for yellow image formation prepared in Example 16. The image quality of the color proof was excellent, and the digital image data were fully reproduced in the color proof.

EXAMPLE 24

A light-sensitive material was prepared in the same manner as in Example 8, except that 0.09 g of Fluorad FC431 was used in place of 0.07 g of Megafac F177P.

A color proof was prepared in the same manner as in Example 8 using the above-prepared light-sensitive material. The image quality of the color proof was excellent, and the digital image data were fully reproduced in the color proof.

EXAMPLE 25

A light-sensitive material was prepared in the same manner as in Example 1, except that the matrix of the strippable layer was changed from Denka Butyral 5000-A to Esrek BH-3 (polyvinyl butyral resin, Sekisui Chemical Co., Ltd., average polymerization degree: about 1,700, butyralation degree: about 65 mol %, remaining vinyl acetate: 3 mol or less).

EXAMPLE 26

A light-sensitive material was prepared in the same manner as in Example 1, except that the matrix of the strippable layer was changed from Denka Butyral 5000-A to Esrek KS-1 (Polyvinyl acetal resin made from butyric aldehyde and propyric aldehyde, Sekisui Chemical Co., Ltd., average polymerization degree: about 500, acetaralation degree: about 70 mol %, remaining vinyl acetate: 3 mol % or less).

EXAMPLE 27

A light-sensitive material was prepared in the same manner as in Example 1, except that the matrix of the strippable layer was changed from Denka Butyral 5000-A to Daiamide 430 (polyamide resin, Daicel Co., Ltd.).

EXAMPLE 28

A light-sensitive material was prepared in the same manner as in Example 1, except that the matrix of the strippable layer was changed from Denka Butyral 5000-A to vinyl chloride/vinyl acetate/maleic anhydride copolymer (MPR-TM, Nisshin Chemical Industry Co., Ltd.).

EXAMPLE 29

A light-sensitive material was prepared in the same manner as in Example 1, except that the matrix of the strippable layer was changed from Denka Butyral 5000-A to ethylene/vinyl acetate copolymer (Evaflex #210, Mitsui Du Pont Chemicals Co., Ltd.).

REFERENCE EXAMPLE 7

A light-sensitive material was prepared in the same manner as in Reference Example 1, except that the matrix of the strippable layer was changed from Denka Butyral 5000-A to Daiamide 430 (polyamide resin, Daicel Co., Ltd.).

REFERENCE EXAMPLE 8

A light-sensitive material was prepared in the same manner as in Reference Example 1, except that the matrix of the strippable layer was changed from Denka Butyral 5000-A to vinyl chloride/vinyl acetate/maleic anhydride copolymer (MPR-TM, Nisshin Chemical Industry Co., Ltd.).

Evaluation of strippability

The light-sensitive materials prepared in Examples 1 & 25 to 29 and Reference Examples 7 & 8 were evaluated in the same manner as in Examples 1 to 3, Comparison Examples 1 & 2 and Reference Examples 1 & 2. The results are set forth in Table 5.

TABLE 5

| Light-sensitive Material | Force required for peeling the layer | |
|---|---|---|
| | Unexposed | Exposed |
| Example 1 | 11 g | 10 g |
| Example 25 | 11 g | 20 g |
| Example 26 | 17 g | 30 g |
| Example 27 | 15 g | >1,000 g |
| Example 28 | 30 g | >1,000 g |
| Example 29 | 950 g | >1,000 g |
| Reference Ex. 7 | 14 g | 12 g |
| Reference Ex. 8 | 30 g | 50 g |

As is evident from the results shown in Table 5, the light-sensitive materials of Reference Examples 7 & 8 using a photopolymerization initiator do not require a large force for peeling the strippable layer. The values of the unexposed and exposed samples are substantially identical.

On the other hand, the exposed samples of Examples 27 to 29 using silver halide requires a very large force for peeling the layer. This problem is solved by using a polyvinyl acetal resin as the matrix of the strippable layer, as is shown in Examples 1, 25 & 26.

Further, the light-sensitive materials of Reference Examples 7 & 8 form a good transferred image. On the other hand, only the unexposed area of the samples of Examples 27 to 29 was transferred, while the exposed area was not transferred. Therefore, Examples 27 to 29 do not form a clear transferred image. This problem is also solved by using a polyvinyl acetal resin as the matrix of the strippable layer, as is shown in Examples 1, 25 & 26.

EXAMPLE 30

Light-sensitive materials for black, cyan and magenta image formation were prepared in the same manner as in Example 25, except that the black, cyan and magenta pigments used in Example 7 were used in place of the yellow pigment.

A color proof was prepared in the same manner as in Example 7 using the above-prepared light-sensitive materials and the light-sensitive material for yellow image formation prepared in Example 25. The image quality of the color proof was excellent, and the digital image data were fully reproduced in the color proof.

EXAMPLE 31

A light-sensitive material was prepared in the same manner as in Example 8, except that the matrix of the strippable layer was changed from the polyamide resin to a polyvinyl butyral resin (Esrek BX-5, flow softening point: 230° C., Sekisui Chemical Co., Ltd.).

A color proof was prepared in the same manner as in Example 8 using the above-prepared light-sensitive material. The image quality of the color proof was excellent, and the digital image data were fully reproduced in the color proof.

We claim:

1. A light-sensitive material which comprises a support, a strippable layer and the light-sensitive polymerizable layer in order, said light-sensitive polymerizable layer containing silver halide, a reducing agent and an ethylenically unsaturated polymerizable compound or a cross-linkable polymer, said strippable layer having a thickness of not less than 1.0 μm and containing a fluorine compound in an amount not less than 1 wt. %.

2. The light-sensitive material as claimed in claim 1, wherein the light-sensitive polymerizable layer comprises a light-sensitive layer containing the silver halide and a polymerizable layer containing the ethylenically unsaturated polymerizable compound or the cross-linkable polymer, and the light-sensitive material comprises the support, the strippable layer, the polymerizable layer and the light-sensitive layer in order.

3. The light-sensitive material as claimed in claim 1, wherein the light-sensitive polymerizable layer further contains a colorant.

4. The light-sensitive material as claimed in claim 1, wherein the strippable layer contains a matrix polymer having a flow softening point which is higher the heating temperature required for developing silver halide.

5. The light-sensitive material as claimed in claim 1, wherein the strippable layer contains a fluorine compound in an amount of not less than 1 wt. %.

6. The light-sensitive material as claimed in claim 1, wherein the strippable layer contains a polyvinyl acetal resin as matrix.

* * * * *